(12) United States Patent
Yang et al.

(10) Patent No.: US 9,269,616 B2
(45) Date of Patent: Feb. 23, 2016

(54) SEMICONDUCTOR DEVICE STRUCTURE AND METHOD OF FORMING

(71) Applicant: Taiwan Semiconductor Manufacturing Co., Ltd, Hsin-Chu (TW)

(72) Inventors: Zhuo-Cang Yang, Hsinchu (TW); Chih-Kuan Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 62 days.

(21) Appl. No.: 14/153,848

(22) Filed: Jan. 13, 2014

(65) Prior Publication Data

US 2015/0200134 A1 Jul. 16, 2015

(51) Int. Cl.
| | |
|---|---|
| *H01L 21/70* | (2006.01) |
| *H01L 21/768* | (2006.01) |
| *H01L 29/417* | (2006.01) |
| *H01L 27/12* | (2006.01) |
| *H01L 27/06* | (2006.01) |

(52) U.S. Cl.
CPC ...... *H01L 21/76877* (2013.01); *H01L 27/1203* (2013.01); *H01L 27/1207* (2013.01); *H01L 29/4175* (2013.01); *H01L 27/0629* (2013.01); *H01L 27/0647* (2013.01)

(58) Field of Classification Search
None
See application file for complete search history.

(56) References Cited

U.S. PATENT DOCUMENTS

| | | | | |
|---|---|---|---|---|
| 5,723,895 | A * | 3/1998 | Takahashi | 257/499 |
| 2008/0001183 | A1* | 1/2008 | Kapoor | 257/256 |

* cited by examiner

*Primary Examiner* — Sonya D McCall Shepard
(74) *Attorney, Agent, or Firm* — Birch, Stewart, Kolasch & Birch, LLP

(57) ABSTRACT

Embodiments of a semiconductor device structure and a method of forming a semiconductor device structure are provided. The semiconductor device structure includes an insulating layer having a top surface, a bottom surface and a side surface. The semiconductor device structure also includes a first semiconductor substrate formed over the bottom surface of the first insulating layer. The semiconductor device structure further includes a conductive feature formed only adjacent to the side surface of the insulating layer on the first semiconductor substrate. In addition, the semiconductor device structure includes a second semiconductor substrate formed over the top surface of the insulating layer. The second semiconductor substrate includes a device-forming region formed directly over the insulating layer such that a projection region of the device-forming region is positioned inside the insulating layer.

20 Claims, 19 Drawing Sheets

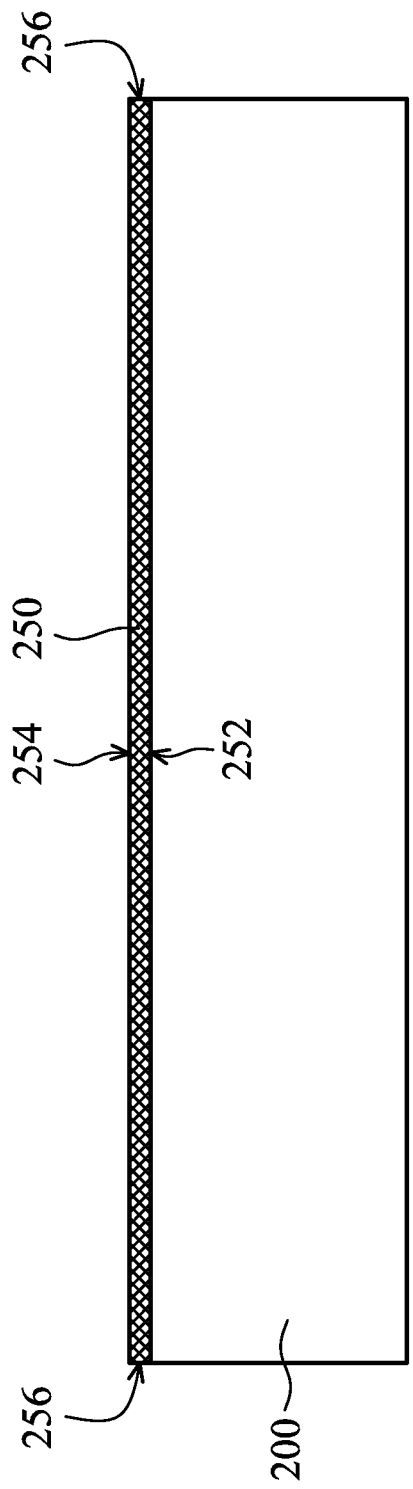
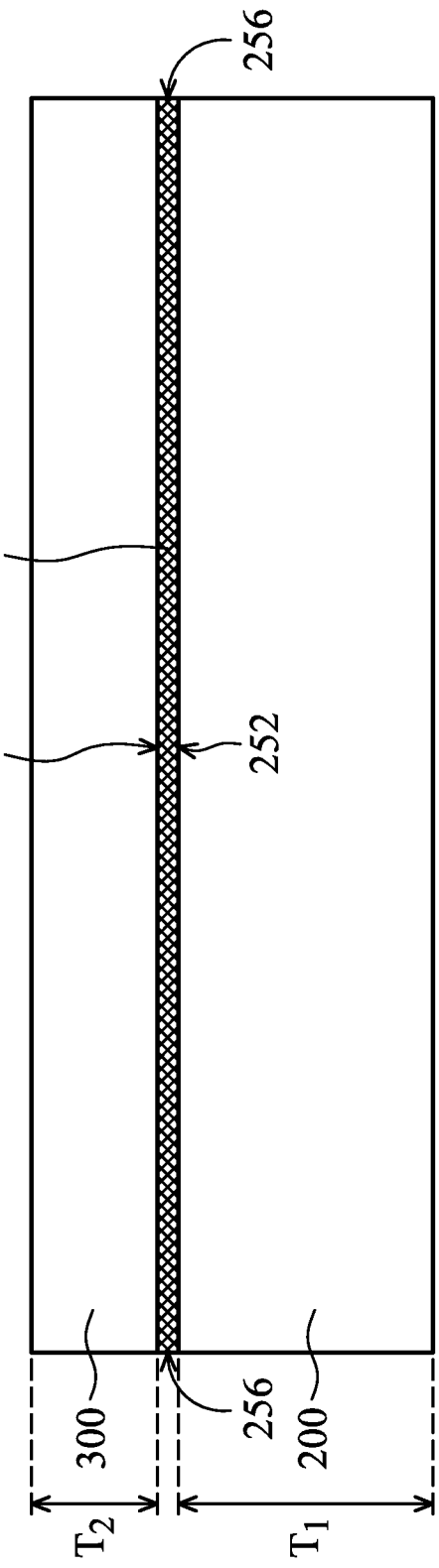
FIG. 8
FIG. 9

SEMICONDUCTOR DEVICE STRUCTURE AND METHOD OF FORMING

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multichip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components may also require smaller packages that utilize less area than packages of the past, in some applications.

Bipolar-CMOS (complementary metal oxide semiconductor transistor)-DMOS (double diffused metal oxide semiconductor transistor) (BCD) is a technology for power management integrated circuits (PMICs). BCD can integrate different process technologies for bipolar, CMOS and DMOS onto a single chip. Bipolar is used for high-current driving and analog functions, CMOS for digital-circuit design, and DMOS for power and high-voltage handling capacity.

BRIEF DESCRIPTION OF THE DRAWINGS

For a more complete understanding of the present disclosure, and the advantages thereof, reference is now made to the following descriptions taken in conjunction with the accompanying drawings.

FIGS. 8-10 are cross-sectional views of various stages of a method for forming a semiconductor device structure in accordance with some embodiments of the disclosure.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and/or after the method, and some of the operations described can be replaced or eliminated for other embodiments of the method.

Embodiments provide a semiconductor device structure and a method for forming a semiconductor device structure. In some embodiments, the semiconductor device structure includes a first semiconductor substrate, a second semiconductor substrate and an insulating layer. The second semiconductor substrate is bonded to the first semiconductor substrate by connecting to the insulating layer. In some embodiments, the first semiconductor substrate serves as a carrier wafer, and the second semiconductor substrate serves as a substrate for semiconductor devices formed thereon. The insulating layer underneath the second semiconductor substrate serves as an electrical isolation feature to isolate the semiconductor devices. In some embodiments, the insulating layer is formed between two bonded substrates or wafers. In some embodiments, the insulating layer is used to replace of doped and/or epitaxial isolation features for noise reduction and parasitic BJT elimination. For example, the doped and/or epitaxial isolation features include well-isolation regions or buried layer features. Therefore, the insulating layer can be applied as an isolation feature in the bipolar-CMOS-DMOS (BCD) and or high-voltage (HV) technology.

Figure 1:
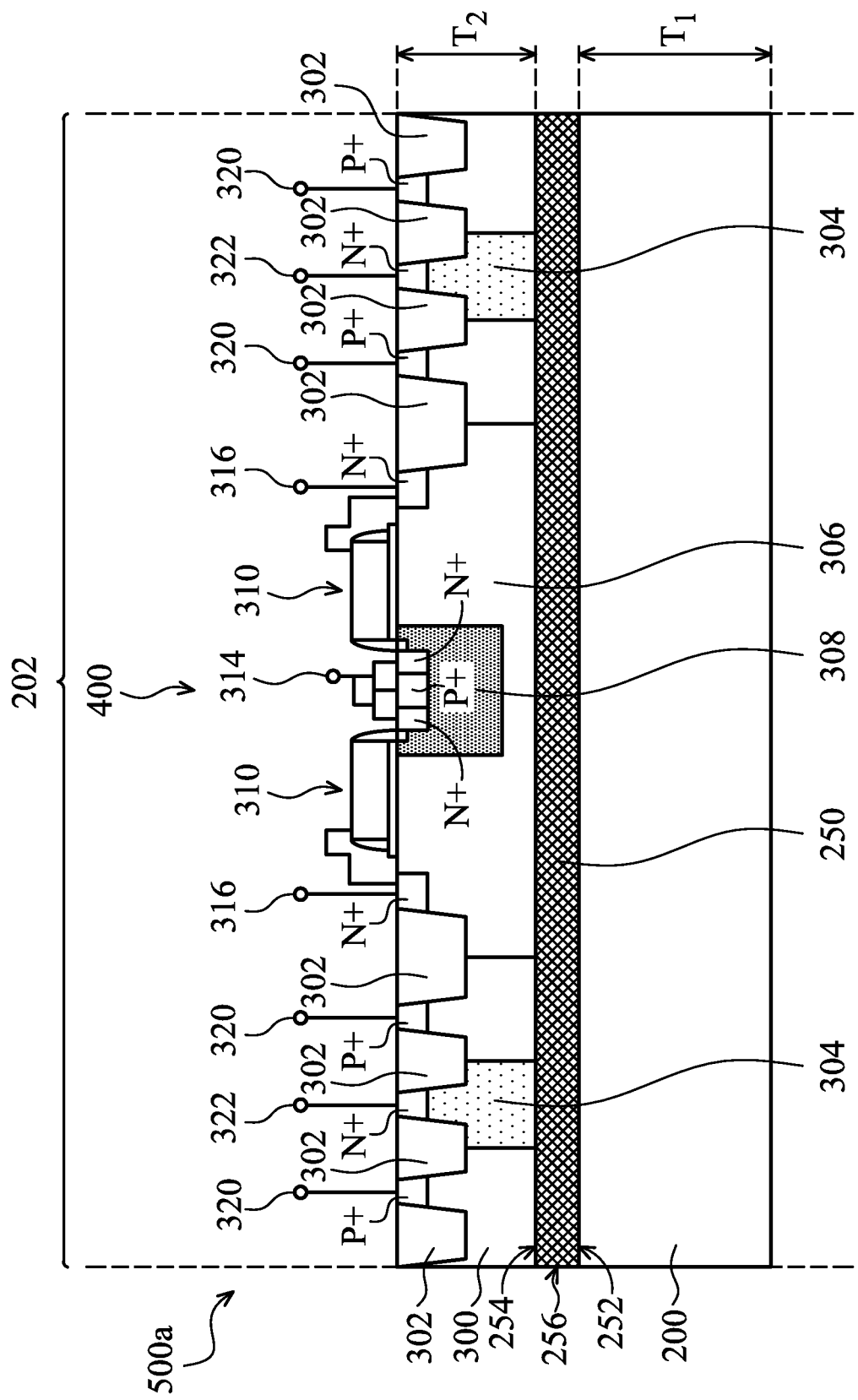
FIGS. 1-6 show cross-sectional representations of semiconductor devices in accordance with some embodiments.

FIGS. 1-6 show cross-sectional representations of semiconductor device structures 500a-500f in accordance with some embodiments. As shown in FIG. 1, the semiconductor device structure 500a includes a first semiconductor substrate 200, a second semiconductor substrate 300 and an insulating layer 250 in accordance with some embodiments. In some embodiments, the first semiconductor substrate 200 and the second semiconductor substrate 300 are wafers. The second semiconductor substrate 300 of the semiconductor device structures 500a includes a first device-forming region 202. The first device-forming region 202 is formed directly over the insulating layer 250 such that a projection region of the first device-forming region 202 is positioned inside the insulating layer 250.

As shown in FIG. 1, the first semiconductor substrate 200 includes a row semiconductor wafer, in accordance with some embodiments. In some embodiments, the first semiconductor substrate 200 serves as a carrier wafer, so that no semiconductor device is formed directly on or in the first semiconductor substrate 200.

In some embodiments, the insulating layer 250 has a top surface 254, a bottom surface 252 opposite to the top surface 254 and a side surface 256 as shown in FIG. 1. In some embodiments, the insulating layer 250 underneath the second semiconductor substrate 300 serves as an electrical isolation feature to isolate the semiconductor devices formed on or in the second semiconductor substrate 300. In some embodiments, the top surface 254 and the bottom surface 252 of the insulating layer 250 fully cover or partially cover a top of the first semiconductor substrate 200 and a bottom of the second semiconductor substrate 300, respectively. As shown in FIG. 1, the top surface 254 and the bottom surface 252 of the insulating layer 250 fully cover the top of the first semiconductor substrate 200 and the bottom of the second semiconductor substrate 300, respectively. In some embodiments, the insulating layer 250 is formed of insulating materials including oxide, nitride, glass, etc. In some embodiments, the insulating layer 250 is formed of insulating materials which can endure a high temperature (which is higher than, for example, 1000° C.). In some embodiments, the insulating layer 250 is formed by methods including spin coating, chemical vapor deposition (CVD), physical vapor deposition (PVD) or thermal process. In some embodiments, a thickness of the insulating layer 250 is in a range from about 100 Å to about 2000 Å for various operation voltages of the semiconductor devices formed on or in the second semiconductor substrate 300.

In some embodiments, the second semiconductor substrate 300 is bonded to the insulating layer 250 as shown in FIG. 1. In some embodiments, the second semiconductor substrate 300 includes a row semiconductor wafer. In some embodiments, the second semiconductor substrate 300 serves as a substrate for semiconductor devices formed directly on or in the second semiconductor substrate 300. In some embodiments, a thickness $T_1$ of the first semiconductor substrate 200 is designed to be greater than a thickness $T_2$ of the second semiconductor substrate 300. Various doped regions of the semiconductor devices, for example, well doped regions, can occupy from bottom to top of the second semiconductor substrate 300. In some embodiments, the second semiconductor substrate 300 includes a device-forming region 202. In some other embodiments, the second semiconductor substrate 300 includes more than one device-forming region 202. In some embodiments, the device-forming region 202 is formed directly over the insulating layer 250. Therefore, a projection region of the device-forming region 202 is positioned inside the insulating layer 250. One or more semiconductor devices are formed within the device-forming region 202. In some embodiments, the semiconductor devices include a metal-oxide-semiconductor (MOS) transistor device, a bipolar junction transistor (BJT), a diode, a resistor or combinations thereof. In some embodiments, one of the semiconductor devices includes a high-voltage (HV) MOS transistor device or a low voltage (LV) MOS transistor device.

In some embodiments, a HV MOS transistor device 400 is formed in the first device-forming region 202 as shown in FIG. 1. For example as shown in FIG. 1, the HV MOS transistor device 400 is formed on or in the second semiconductor substrate 300 doped with P-type dopants. The HV MOS transistor device 400 includes a high-voltage N-well doped region (HVNW) 306, a high-voltage P-well doped region (HVPW) 308 formed over the HVNW 306, a ring-typed gate structure 310 formed within the HVNW 306. In some embodiments, the HV MOS transistor device 400 includes a HVNW 304, which serves as a guard ring of the HV MOS transistor device 400, formed surrounding the HVNW 306. In some embodiments, the HV MOS transistor device 400 includes a number of N-type heavily (N+) doped regions and P-type heavily (P+) doped regions formed in the second semiconductor substrate 300. The N+ doped regions and P+ doped regions formed over different well doped regions are separated from each other by isolation features 302, such as shallow trench isolations (STIs). For example as shown in FIG. 1, the N+ doped regions formed over the HVNW 306 are coupled to a drain node 316 surrounding an outer edge of the gate structure 310. The P+ doped region formed over the HVPW 308 and the N+ doped regions surrounding the P+ doped region are collectively coupled to a source node 314. The N+ doped regions formed over the HVNW 304 are coupled to a guard ring node 322. The P+ doped regions formed in the second semiconductor substrate 300 are coupled to a substrate node 320.

In some embodiments, a bottom of a boundary of the HVNW 304, which serves as a guard ring of the HV MOS transistor device 400, is aligned with an interface between the second semiconductor substrate 300 and the insulating layer 250 (and also serves as the top surface 254 of the insulating layer 250) as shown in FIG. 1. As shown in FIG. 1, the bottom of the boundary of the HVNW 304 is in direct contact with the top surface 254 of the insulating layer 250. That is to say, the bottom of the boundary of the HVNW 304 is limited by the insulating layer 250. In some embodiments, a bottom of a boundary of the HVNW 306 for the gate structure 310 of the HV MOS transistor device 400 formed within is aligned with an interface between the second semiconductor substrate 300 and the insulating layer 250. As shown in FIG. 1, the bottom of the boundary of the HVNW 306 is in direct contact with the top surface 254 of the insulating layer 250. In some embodiments, the HV MOS transistor devices 400 formed within the device-forming regions 202 is isolated from other devices not only by the isolation features 302 laterally surrounding the device-forming region 202, but also by the insulating layer 250 underneath the bottom of the boundary of the HVNWs 304 and 306. Therefore, a vertical current (noise) path of a parasitic bipolar junction transistor (BJT) constructed by the HVPW 308, the HVNW 306 and the second semiconductor substrate 300 doped with P-type dopants can be eliminated by the insulating layer 250 directly under the bottom of the boundary of the HVNW 306.

In some embodiments, the second semiconductor substrate 300 includes a number of device-forming regions for different kinds of semiconductor devices. The insulating layer 250 underneath the second semiconductor substrate 300 serves as an electrical isolation feature to isolate the semiconductor devices in different device-forming regions.

Figure 2:
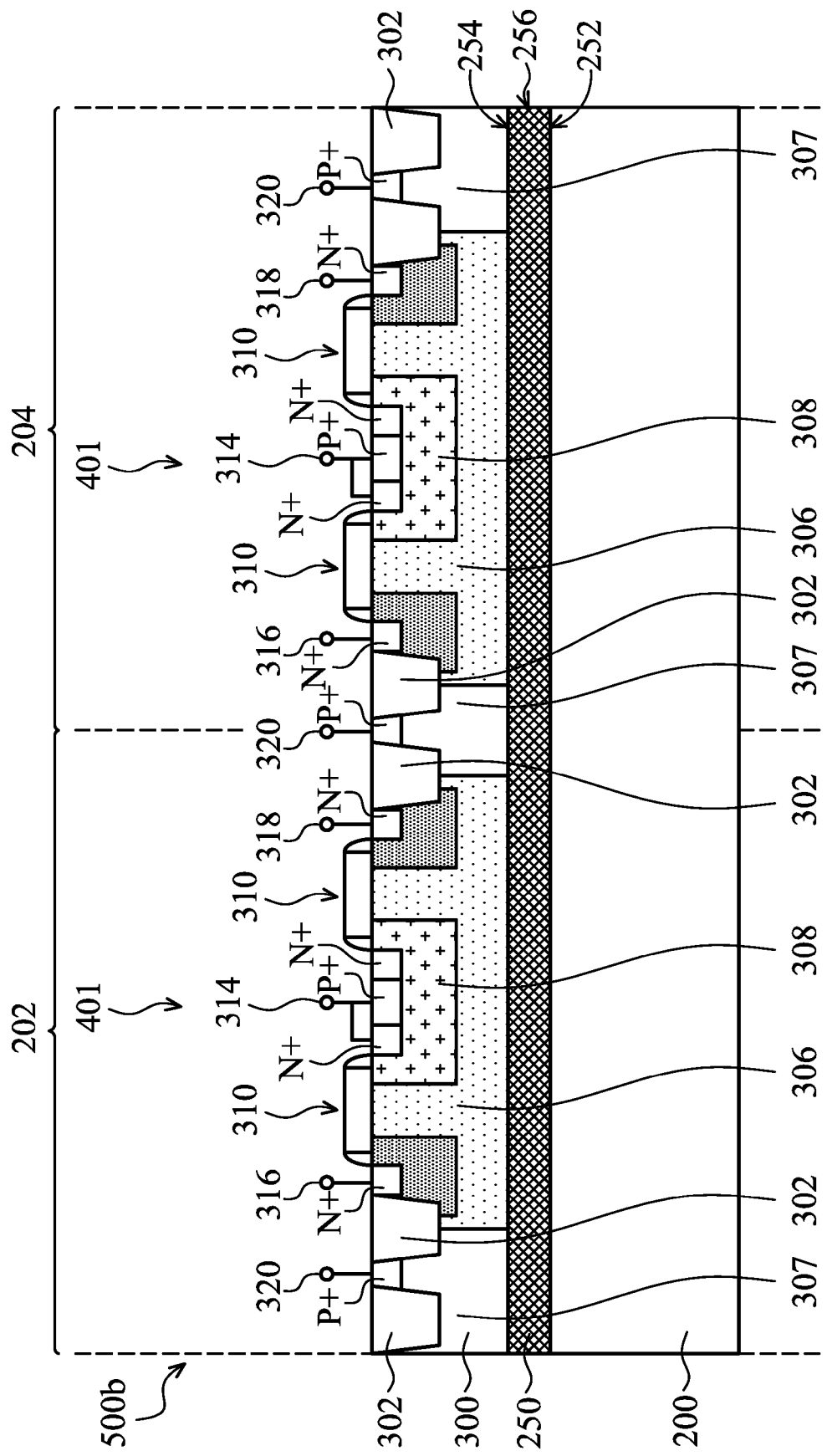

In some embodiments, the second semiconductor substrate 300 of the semiconductor device structure 500b includes two device-forming regions 202 and 204 adjacent to each other as shown in FIG. 2. In some embodiments, the device-forming regions 202 and 204 are formed directly over the insulating layer 250. Therefore, projection regions of the device-forming regions 202 and 204 are positioned inside the insulating layer 250. In some embodiments, two identical semiconductor devices are respectively formed within the two device-forming regions 202 and 204. For example as shown in FIG. 2, two identical HV MOS transistor devices 401 are formed over the second semiconductor substrate 300 doped with P-type dopants. The HV MOS transistor devices 401 are respectively formed within the two device-forming regions 202 and 204. For example as shown in FIG. 2, the HV MOS transistor device 401 includes a high-voltage N-well doped region (HVNW) 306, a high-voltage P-well doped region (HVPW) 308 formed over the HVNW 306 and a ring-typed gate structure 310 formed within the HVNW 306.

In some embodiments, the HV MOS transistor device 401 includes a number of N-type heavily (N+) doped regions and P-type heavily (P+) doped regions formed in the second semiconductor substrate 300. The N+ doped regions and P+ doped regions formed over different well doped regions are separated from each other by isolation features 302, such as shallow trench isolations (STIs). For example as shown in FIG. 2, the N+ doped regions formed over the HVNW 306 are coupled to a drain node 316. The N+ doped regions coupled to the drain node 316 surrounds the gate structure 310. As shown in FIG. 2, the P+ doped region formed over the HVPW 308 and the N+ doped regions surrounding the P+ doped region are collectively coupled to a source node 314. Further, the P+ doped regions formed over the P-type doped regions 307 are coupled to a substrate node 320.

In some embodiments, a bottom of a boundary of the HVNW 306 for the gate structure 310 of the HV MOS transistor device 401 formed within is aligned with an interface between the second semiconductor substrate 300 and the insulating layer 250 as shown in FIG. 2. Also, the bottom of the boundary of the HVNW 306 is aligned with an interface between the second semiconductor substrate 300 and the insulating layer 250 (which also serves as the top surface 254 of the insulating layer 250). As shown in FIG. 2, the bottom of the boundary of the HVNW 306 is in direct contact with the top surface 254 of the insulating layer 250. That is to say, the bottom of the boundary of the HVNW 306 is limited by the insulating layer 250. As shown in FIG. 2, a bottom of a boundary of the P-type doped regions 307 is in direct contact with the top surface 254 of the insulating layer 250. That is to say, the bottom of the boundary of the P-type doped regions 307 is limited by the insulating layer 250. As shown in FIG. 2, the two HV MOS transistor devices 401 respectively formed within the two device-forming regions 202 and 204 are isolated from each other not only by the isolation features 302 and the P-type doped regions 307 lateral between the device-forming regions 202 and 204, but also by the insulating layer 250 underneath the bottom of the boundary of the HVNW 306. Therefore, a vertical current (noise) path of a parasitic bipolar junction transistor (BJT), which is constructed by the HVPW 308, the HVNW 306 and the second semiconductor substrate 300 doped with P-type dopants, of any of the two HV MOS transistor devices 401 can be eliminated by the insulating layer 250 directly under the bottom of the boundary of the HVNW and 306.

Figure 3:
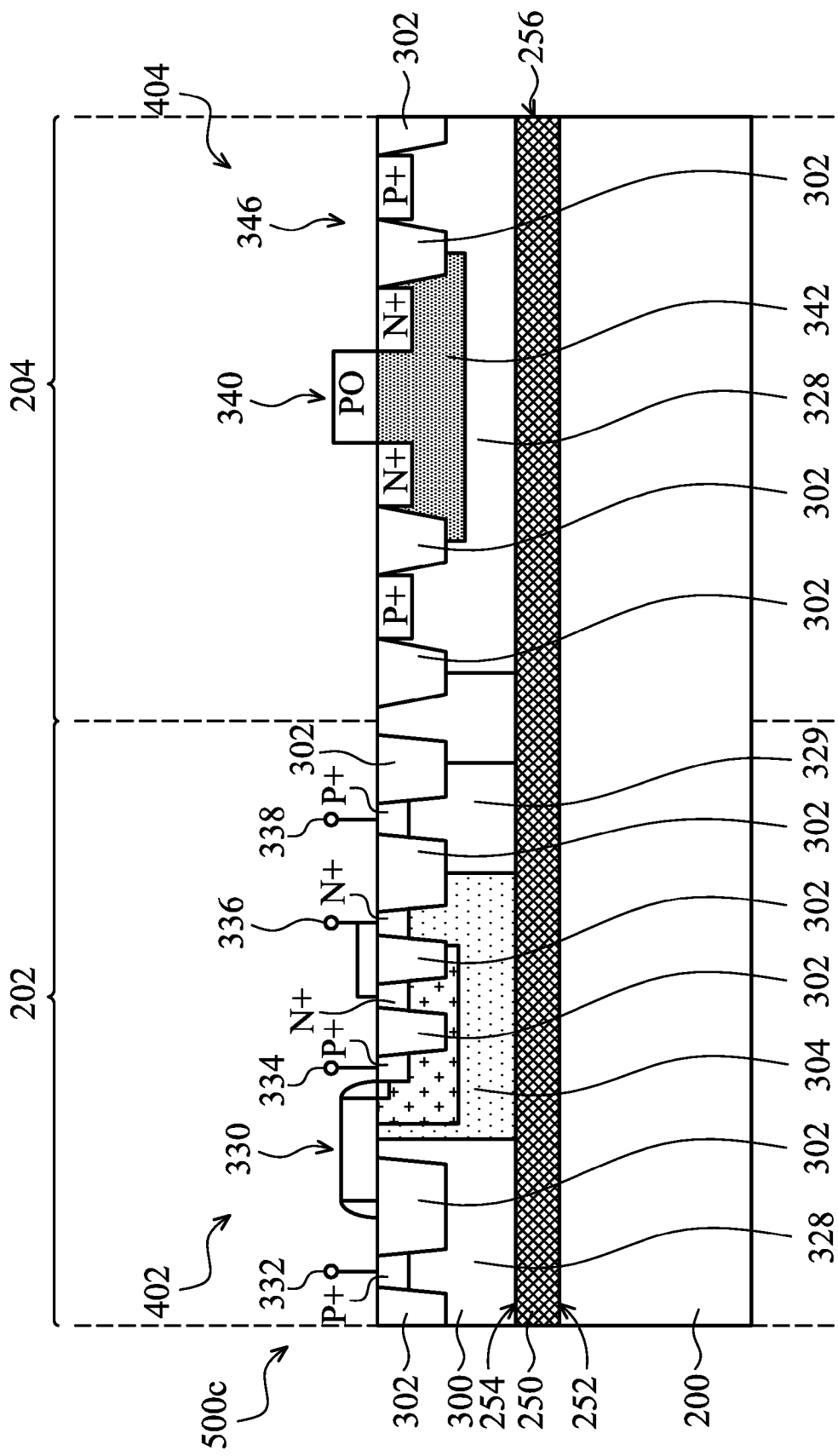

In some embodiments, the second semiconductor substrate 300 of the semiconductor device structure 500c includes two device-forming regions 202 and 204 adjacent to each other as shown in FIG. 3. As shown in FIG. 3, the device-forming region 202 is designed for a HV MOS transistor device 402 formed thereon, and the device-forming region 204 is designed for a low voltage (LV) MOS transistor device 404 formed thereon in accordance with some embodiments. For example, as shown in FIG. 3, the HV MOS transistor device 402 formed over the second semiconductor substrate 300 doped with P-type dopants includes a high-voltage N-well doped region (HVNW) 304, high-voltage P-well doped region (HVPW) 328 and 329 adjacent to opposite sides of the HVNW 304, a gate structure 330 formed over the HVNW 304 and HVPW 328. The HV MOS transistor device 402 includes a number of N-type heavily (N+) doped regions and P-type heavily (P+) doped regions formed in the second semiconductor substrate 300. The N+ doped regions and P+ doped regions formed over different well doped regions are separated from each other by isolation features 302, such as shallow trench isolations (STIs). For example as shown in FIG. 3, the N+ doped regions formed over the HVNW 304 serve as pick-up doped regions for the HVNW 304. The N+ doped regions are coupled to a pick-up node 336. The P+ doped region formed over the HVNW 304 is coupled to a source node 314. The P+ doped region formed over the HVPW 328 are coupled to a drain node 332. The P+ doped region formed over the HVPW 329 is coupled to a substrate node 338.

In some embodiments, the LV MOS transistor device 404 formed over the second semiconductor substrate 300 doped with P-type dopants includes a HVPW 328, a shallow P-type doped region 342 formed over the HVPW 328 and a gate structure 340 formed over the shallow P-type doped region 342 as shown in FIG. 3. The shallow P-type doped region 342 is surrounded by the HVPW 328. The LV MOS transistor device 404 includes a number of N-type heavily (N+) doped regions and P-type heavily (P+) doped regions formed in the second semiconductor substrate 300. The N+ doped regions and P+ doped regions formed over different well doped regions are separated from each other by isolation features 302, such as shallow trench isolations (STIs). For example as shown in FIG. 3, the N+ doped regions formed on opposite sides of the gate structure 340 serve as source and drain doped regions for the LV MOS transistor device 404. The P+ doped regions formed over the HVPW 328 serve as body doped regions for the LV MOS transistor device 404.

In some embodiments, bottoms of boundaries of the HVPWs 328 and 329 in the two device-forming regions 202 and 204 are aligned with an interface between the second semiconductor substrate 300 and the insulating layer 250 (also serves as the top surface 254 of the insulating layer 250) as shown in FIG. 3. As shown in FIG. 3, the bottoms of the boundaries of the HVPWs 328 and 329 in the two device-forming regions 202 and 204 are in direct contact with the top surface 254 of the insulating layer 250. That is to say, the bottoms of boundaries of the HVPWs 328 and 329 in the two device-forming regions 202 and 204 are limited by the insulating layer 250. A bottom of the boundary of the HVNW 304 in the device-forming region 202 is aligned with an interface between the second semiconductor substrate 300 and the insulating layer 250. As shown in FIG. 3, the bottom of the boundary of the HVNW 304 is in direct contact with the top surface 254 of the insulating layer 250. That is to say, the bottom of the boundary of the HVNW 304 is limited by the insulating layer 250. As shown in FIG. 3, the HV MOS transistor device 402 formed within the device-forming region 202 and the LV MOS transistor device 404 LV MOS transistor device 404 formed within the device-forming region 204 are isolated from each other not only by the isolation features 302 laterally therebetween, but also by the insulating layer 250 underneath the bottom of the boundary of the HVNW 304 and the HVPWs 328 and 329. Therefore, a vertical current (noise) path of a parasitic bipolar junction transistor (BJT), which is constructed by the HVPW 328, the HVNW 304 and the second semiconductor substrate 300 doped with P-type dopants, of the HV MOS transistor device 402 can be eliminated by the insulating layer 250 directly under the bottom of the boundary of the HVNW 306.

Figure 4:
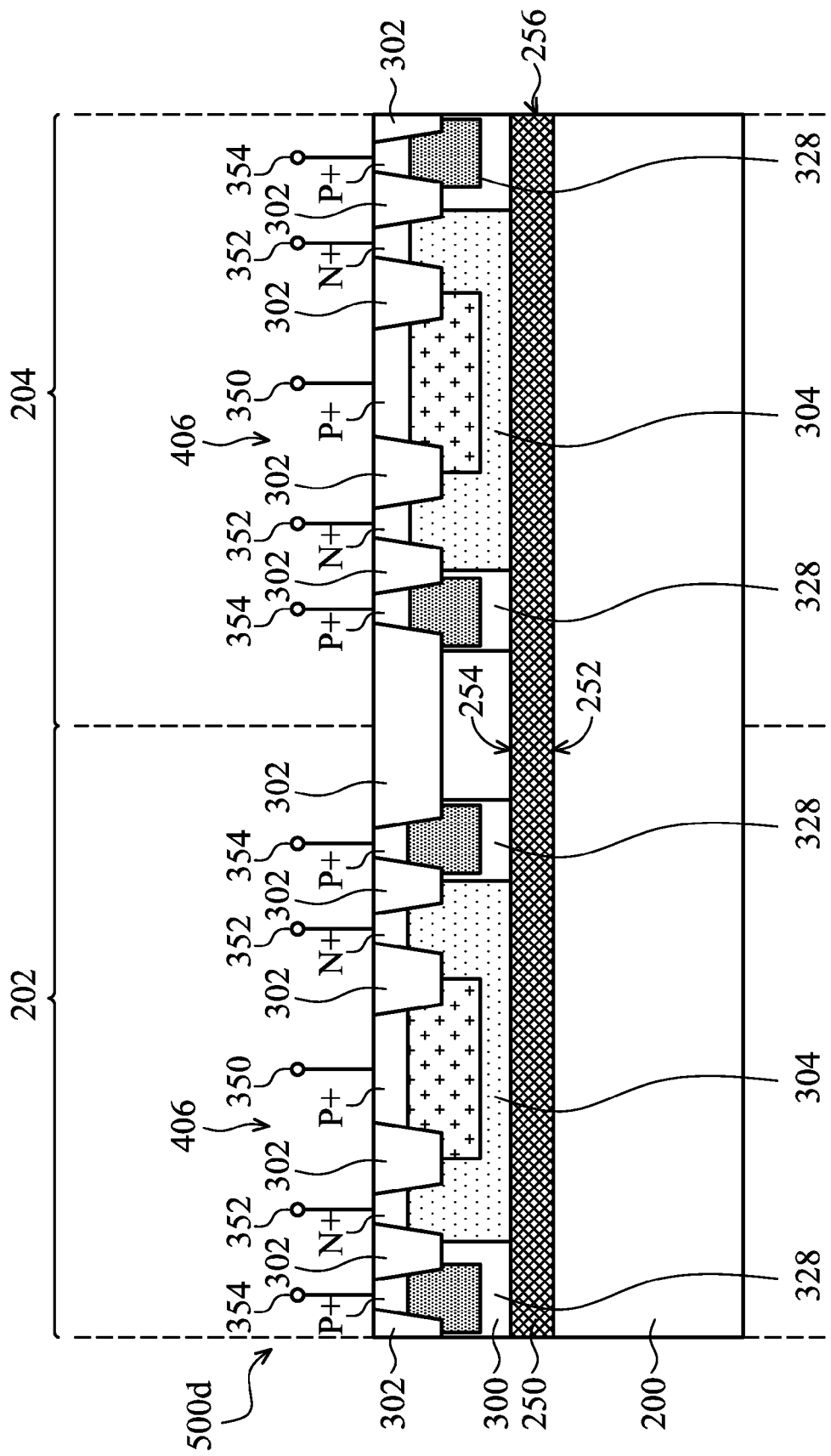

As shown in FIG. 4, the second semiconductor substrate 300 of the semiconductor device structure 500d includes two device-forming regions 202 and 204 adjacent to each other, in accordance with some embodiments. In some embodiments, two identical semiconductor devices are respectively formed within the two device-forming regions 202 and 204. For example as shown in FIG. 4, two identical diodes 406 are formed over the second semiconductor substrate 300 doped with P-type dopants. The two identical diodes 406 are respectively formed within the two device-forming regions 202 and 204. For example as shown in FIG. 4, each of two identical diodes 406 includes a high-voltage N-well doped region (HVNW) 304 and a high-voltage P-well doped region (HVPW) 328 formed surrounding the HVNW 304. The HVPW 328 serves as a guard ring of the diode 406. Each of two identical diodes 406 includes a number of N-type heavily (N+) doped regions and P-type heavily (P+) doped regions formed in the second semiconductor substrate 300. The N+ doped regions and P+ doped regions formed over different well doped regions are separated from each other by isolation features 302, such as shallow trench isolations (STIs). For example as shown in FIG. 4, the P+ doped region formed over the HVNW 304 is coupled to an anode node 350. The N+ doped region formed over the HVNW 304 is coupled to a cathode node 352. The P+ doped region formed over the HVPW 328 is coupled to a substrate node 354.

In some embodiments, a bottom of a boundary of the HVNW 304 for the cathode of each of the diodes 406 formed within is aligned with an interface between the second semiconductor substrate 300 and the insulating layer 250 (also serves as the top surface 254 of the insulating layer 250) as shown in FIG. 4. As shown in FIG. 4, the bottom of the boundary of the HVNW 304 is in direct contact with the top surface 254 of the insulating layer 250. That is to say, the bottom of the boundary of the HVNW 304 is limited by the insulating layer 250. In some embodiments, a bottom of the boundary of the HVPW 328 is aligned with the interface between the second semiconductor substrate 300 and the insulating layer 250. As shown in FIG. 4, the bottom of the boundary of the HVPW 328 is in direct contact with the top surface 254 of the insulating layer 250. That is to say, the bottom of the boundary of the HVPW 328 is limited by the insulating layer 250. As shown in FIG. 4, the two diodes 406 respectively formed within the two device-forming regions 202 and 204 are isolated from each other not only by the isolation features 302 lateral between the device-forming regions 202 and 204, but also by the insulating layer 250 underneath the bottom of the boundary of the HVNW 304. Therefore, a vertical current (noise) path of a parasitic bipolar junction transistor (BJT), which is constructed by the P+ doped region formed over the HVNW 304, the HVNW 304 and the HVPW 328, of any of the two diodes 406 can be eliminated by the insulating layer 250 directly under the bottom of the boundary of the HVNW 304.

Figure 5:
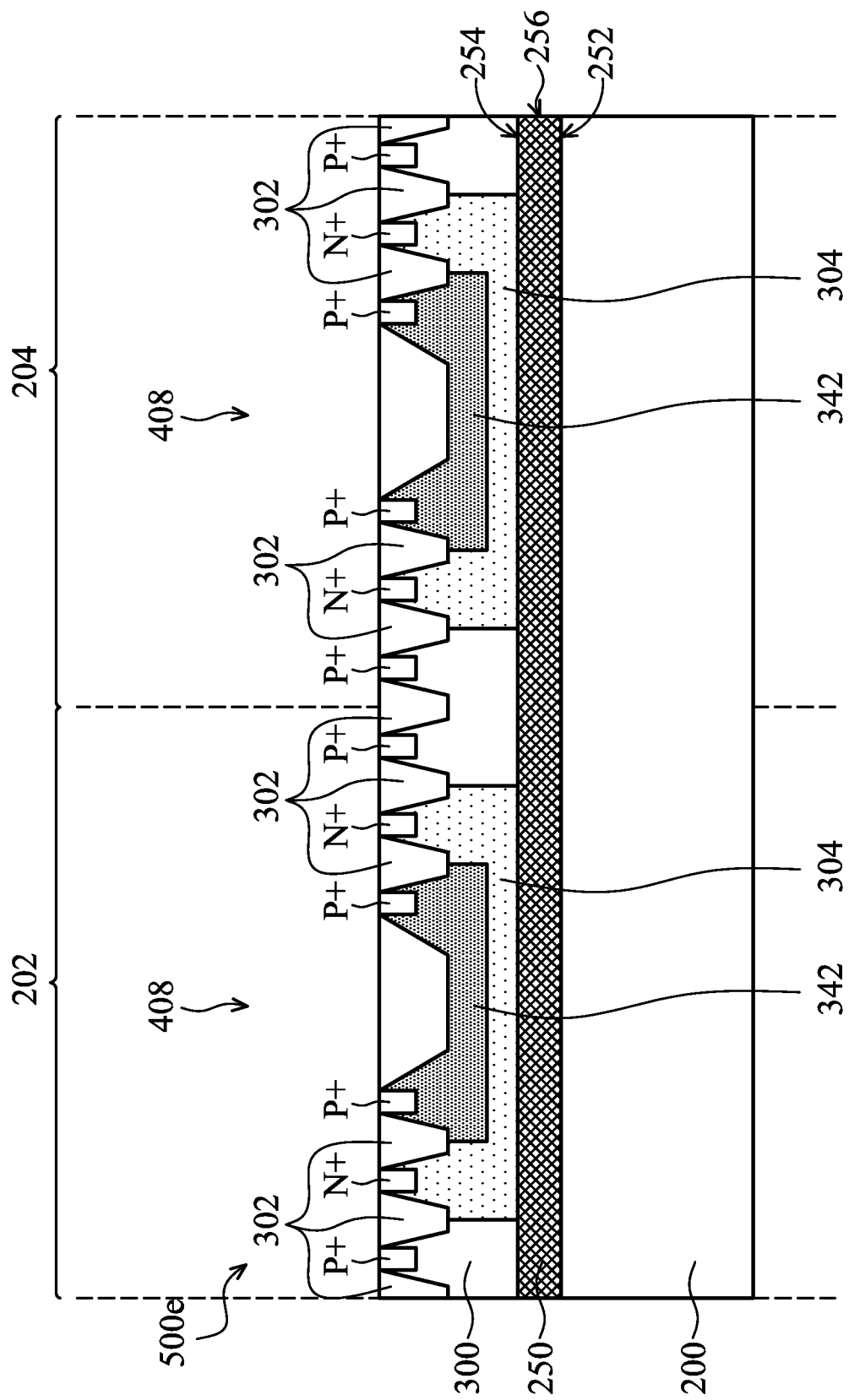

As shown in FIG. 5, the second semiconductor substrate 300 of the semiconductor device structure 500e includes two device-forming regions 202 and 204 adjacent to each other, in accordance with some embodiments. In some embodiments, two identical semiconductor devices are respectively formed within the second semiconductor substrate 300. For example as shown in FIG. 5, two identical resistors 408 are formed in the second semiconductor substrate 300 doped with P-type dopants. The two identical resistors 408 are respectively formed within the two device-forming regions 202 and 204. For example as shown in FIG. 5, each of the two identical resistors 408 includes a high-voltage N-well doped region (HVNW) 304 formed in the second semiconductor substrate 300. A shallow P-type doped region 342 is formed over the HVNW 304. The shallow P-type doped region 342 is surrounded by the HVNW 304. Each of two identical resistors 408 includes a number of N-type heavily (N+) doped regions and P-type heavily (P+) doped regions formed in the second semiconductor substrate 300. The N+ doped regions and P+ doped regions formed over different well doped regions are separated from each other by isolation features 302, such as shallow trench isolations (STIs). For example as shown in FIG. 5, the two P+ doped regions formed over the shallow P-type doped region 342 respectively serve as two terminals of the resistor 408. The N+ doped regions formed over the HVNW 304 serve as guard ring terminals of the resistor 408. The P+ doped regions formed in second semiconductor substrate 300 doped with P-type dopants serve as substrate terminals of the resistor 408.

In some embodiments, a bottom of a boundary of the HVNW 304 for the cathode of each of the two identical resistors 408 formed within is aligned with an interface between the second semiconductor substrate 300 and the insulating layer 250 (also serves as the top surface 254 of the insulating layer 250) as shown in FIG. 5. As shown in FIG. 5, the bottom of the boundary of the HVNW 304 is in direct contact with the top surface 254 of the insulating layer 250. That is to say, the bottom of the boundary of the HVNW 304 is limited by the insulating layer 250. As shown in FIG. 5, the two identical resistors 408 respectively formed within the two device-forming regions 202 and 204 are isolated from each other not only by the isolation features 302 lateral between the device-forming regions 202 and 204, but also by the insulating layer 250 underneath the bottom of the boundary of the HVNW 304. Therefore, a vertical current (noise) path of a parasitic bipolar junction transistor (BJT), which is constructed by the shallow P-type doped region 342 formed over the HVNW 304, the HVNW 304 and the second semiconductor substrate 300 (doped with P-type dopants), of any of the two resistors 408 can be eliminated by the insulating layer 250 directly under the bottom of the boundary of the HVNW 304.

Figure 6:
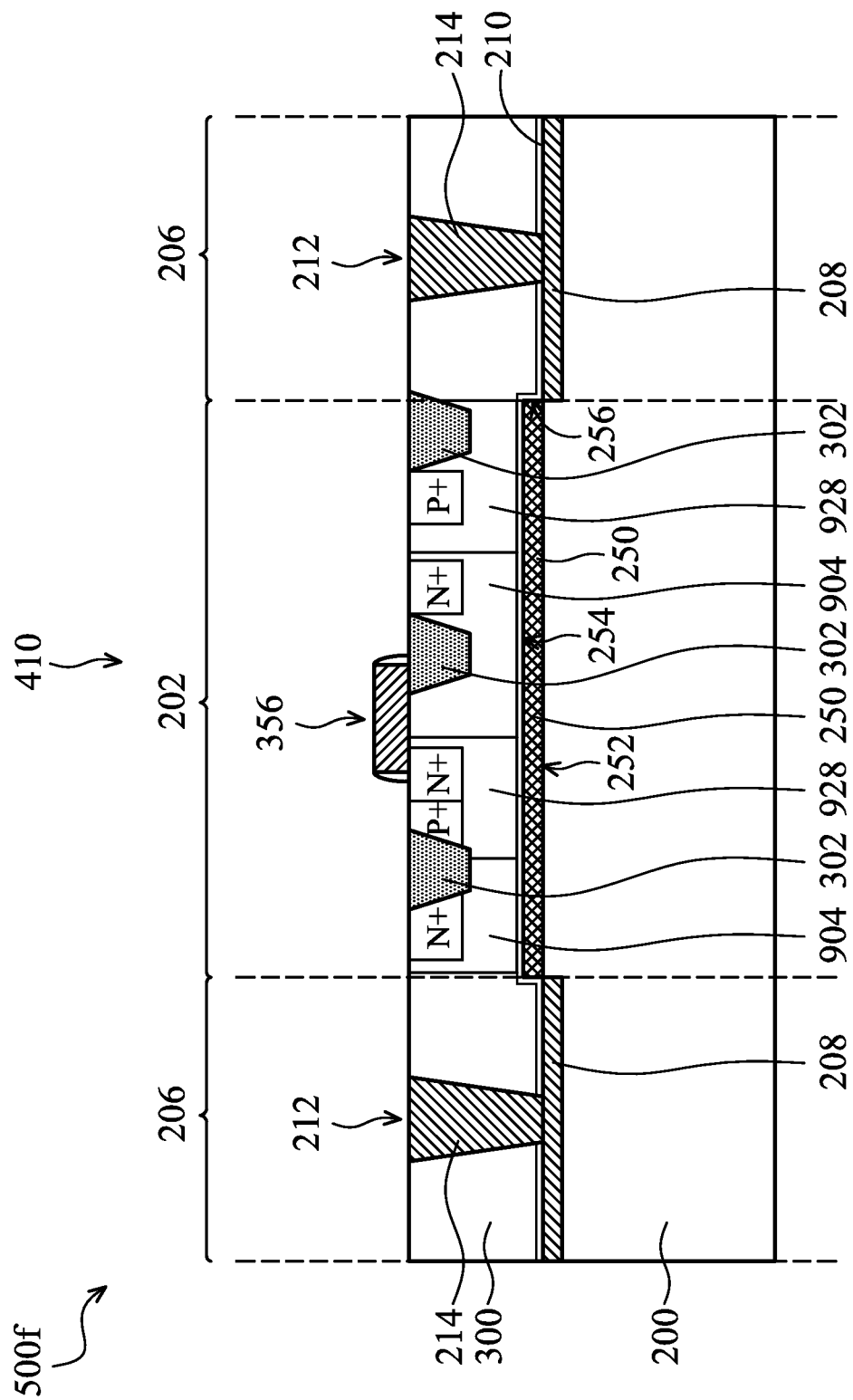

As shown in FIG. 6, the semiconductor device structure 500f includes an insulating layer and conductive feature(s) 208, in accordance with some embodiments. In some embodiments, the insulating layer 250 of the semiconductor device structure 500f can be designed to partially cover the first semiconductor substrate 200. Therefore, the conductive features 208 of the semiconductor device structure 500f can be formed in or over a portion of the first semiconductor substrate 200 without being covered by the insulating layer 250. In some embodiments, the conductive features 208 are formed adjacent to the side surface 256 of the insulating layer 256. In some embodiments, the conductive features 208 serve as resistors. In some embodiments, the conductive features 208 are formed by an implantation process. In some embodiments, an insulating layer 210 is formed covering insulating layer 250 and the conductive features 208. However, in some embodiments, the insulating layer 210 is not formed covering the insulating layer 250 and the conductive features 208. In some embodiments, the insulating layer 210 serves as an isolation feature for the conductive features 208.

In some embodiments, the second semiconductor substrate 300 is bonded over the first semiconductor substrate 200 by connecting to the insulating layer 210 or 250 as shown in FIG. 6. In some embodiments, the second semiconductor substrate 300 includes a device-forming region 202 and a pick-up region 206 as shown in FIG. 6. The device-forming region 202 is defined by the insulating layer 250 partially covering the first semiconductor substrate 200 and the second semiconductor substrate 300. The insulating layer 250 serves as an electrical isolation feature for the device-forming region 202. Therefore, a projection region of the device-forming region 202 is positioned inside the insulating layer 250. In some embodiments, the pick-up region 206 is defined by a region of the second semiconductor substrate 300 where the conductive feature 208 is positioned thereunder. In some embodiments, active and/or passive semiconductor devices including a MOS transistor device, a BJT, a diode, a resistor or combinations thereof are prohibited from being formed on and/or in the second semiconductor substrate 200 within the pick-up region 206. The device-forming region 202 and the pick-up region 206 are laterally isolated from each other by isolation features (such as the isolation features 302 as shown in FIG. 6), such as shallow trench isolations (STIs).

In some embodiments, a semiconductor device(s) is formed within the device-forming region 202 as shown in FIG. 6. In some embodiments, the semiconductor device structure 500g includes a HV MOS transistor device 410 formed within the device-forming region 202 of the second semiconductor substrate 300. The HV MOS transistor device 410 includes HVNWs 904 and HVPWs 928 alternatively formed in the second semiconductor substrate 300. In some embodiments, a bottom of a boundary of each of the HVNWs 904 or the HVPWs 928 within the device-forming region 202 is in contact with the insulating layer 210 as shown in FIG. 6. In some other embodiments, the insulating layer 210 is not formed or does not cover the insulating layer 250. In these cases, a bottom of a boundary of each of the HVNWs 904 or the HVPWs 928 within the device-forming region 202 is in contact with the insulating layer 250. As shown in FIG. 6, a gate structure 356 is formed over the HVNW 904 and HVPW 928 within the device-forming regions 202. A portion of each of the gate structures 356 covers the isolation features 302 over the HVNW 304.

In some embodiments, the HV MOS transistor device 410 includes a number of N-type heavily (N+) doped regions and P-type heavily (P+) doped regions are formed within the device-forming region 202 as shown in FIG. 6. In some embodiments, the N+ doped region formed over the HVNW 904 serves as a drain doped region for the HV MOS transistor device 410 as shown in FIG. 6. The N+ doped region and the P+ doped region adjacent to each other formed over the HVPW 928 serves as a source doped region for HV MOS transistor device 410. The N+ doped region formed over the HVNW 904 away from the gate structure 356 serves as a substrate pick-up doped region. The P+ doped region formed over the HVPW 928 away from the gate structure 356 serves as a guard ring doped region.

As shown in FIG. 6, the semiconductor device structure 500f further includes recesses 212 formed through the second semiconductor substrate 300 within the pick-up region 206, in accordance with some embodiments. In some embodiments, the recesses 212 are trenches. As shown in FIG. 6, the semiconductor device structure 500f includes conductive plugs 214 in the recesses 212. In some embodiments, the conductive plugs 214 serve as electrical connections for the conductive features 208. For example, the conductive plugs 214 are through hole vias (TSVs). The conductive features 208 are electrically connected to the conductive pattern 382 through the conductive plugs 214 within the pick-up region 206.

In some embodiments, bottoms of boundaries of the HVNWs 904 and HVPWs 928 of the HV MOS transistor device 410 within the device-forming region 202 are aligned with an interface between the second semiconductor substrate 300 and the insulating layer 250 (also serves as the top surface 254 of the insulating layer 250) as shown in FIG. 6. As shown in FIG. 6, the bottoms of boundaries of the HVNWs 904 are in direct contact with the top surface 254 of the insulating layer 250. That is to say, the bottoms of boundaries of the HVNWs 904 are limited by the insulating layer 250. As shown in FIG. 6, the bottoms of boundaries of the HVPWs 928 are in direct contact with the top surface 254 of the insulating layer 250. That is to say, the bottoms of boundaries of the HVPWs 928 are limited by the insulating layer 250. As shown in FIG. 6, the HV MOS transistor devices 410 within the device-forming region 202 is isolated from the conductive patterns 382 under the pick-up region 206 of the second semiconductor substrate 300 not only by the isolation features 302 lateral between the device-forming region 202 and the pick-up region 206, but also by the insulating layer 250 underneath the bottom of the boundary of the HVNWs 904 and HVPWs 928. Therefore, a vertical current (noise) path of a parasitic bipolar junction transistor (BJT), which is constructed by the P+ doped region in HVPW 928, the HVPW 928 and the HVNW 904, of the HV MOS transistor device 410 can be eliminated by the insulating layer 250 directly under the bottom of the boundary of the HVNWs 904 and HVPWs 928. In some embodiments, two or more than two device-forming regions can be formed directly over the insulating layer 250. Therefore, projection regions of the device-forming regions are positioned inside the insulating layer 250.

Figure 7:
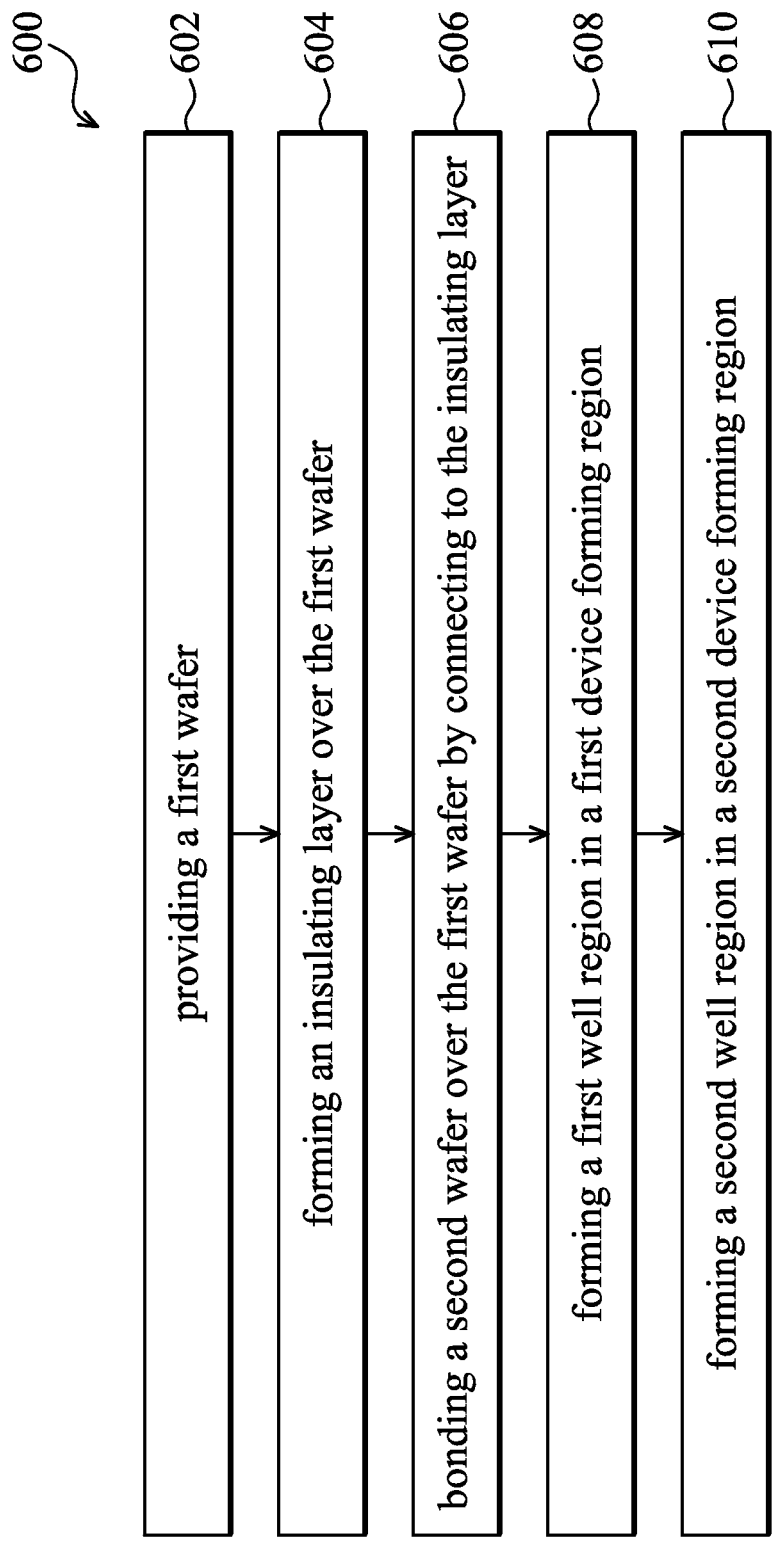
FIG. 7 is a flow chart of a method for forming a semiconductor device structure in accordance with some embodiments of the disclosure.
Figure 10:
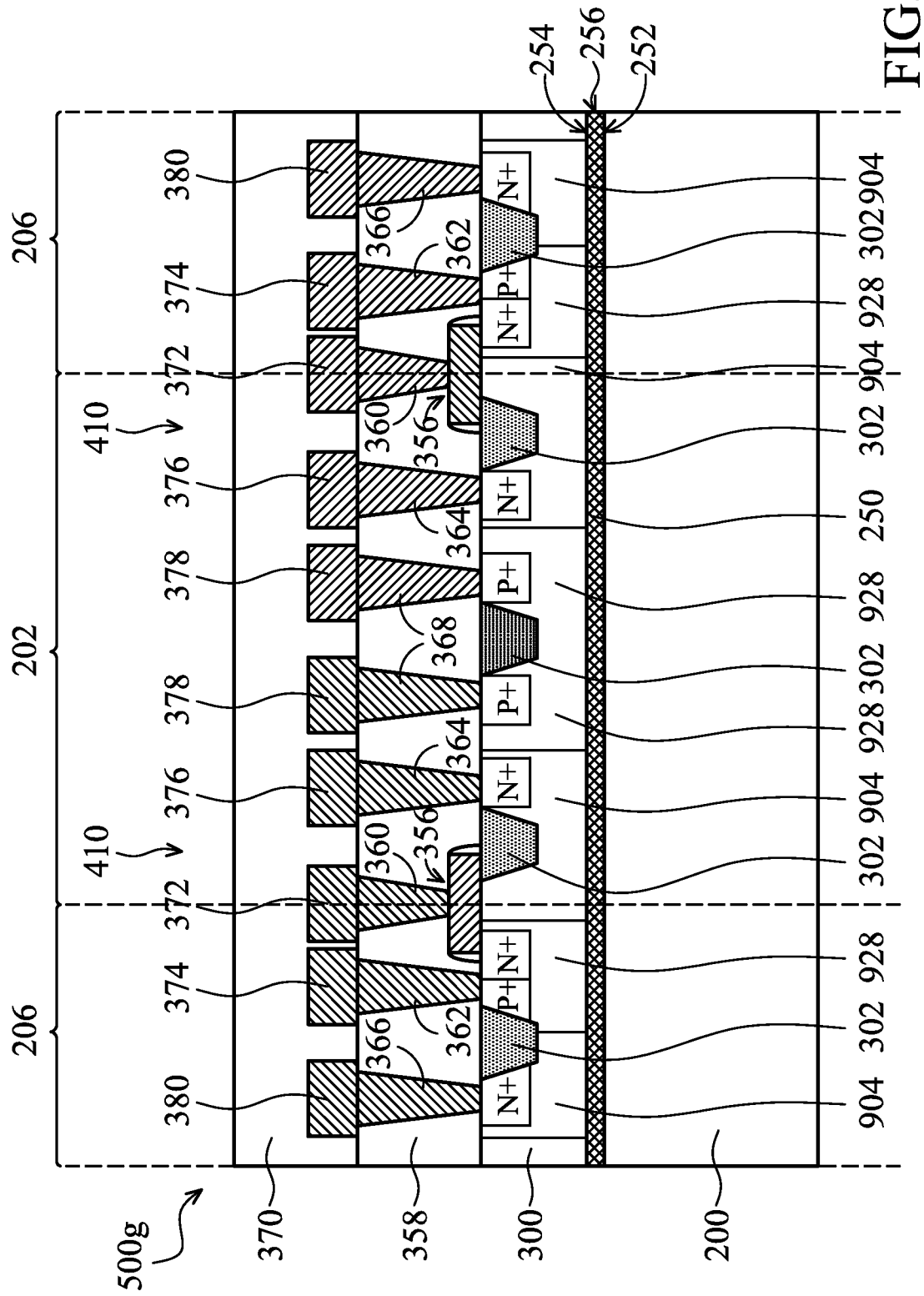

FIG. 7 is a flow chart of a method 600 for forming a semiconductor device structure in accordance with some embodiments. FIGS. 8-10 are cross-sectional views of various stages of a method for forming a semiconductor device structure 500g in accordance with some embodiments of the disclosure. Please refer to FIGS. 7 and 8, in operation 602, a first semiconductor substrate 200 is provided. In some embodiments, the first semiconductor substrate 200 includes a row semiconductor wafer. In some embodiments, the first semiconductor substrate 200 serves as a carrier wafer.

Afterwards, please refer to FIGS. 7 and 8; in operation 604, an insulator layer 250 is formed over the first semiconductor substrate 200. In some embodiments, the insulating layer 250 has a top surface 254, a bottom surface 252 opposite to the top surface 254 and a side surface 256. The bottom surface 252 of the insulating layer 250 is in contact with the first semiconductor substrate 200. Therefore, a position of an interface between the insulating layer 250 and the first semiconductor substrate 200 is aligned with the bottom surface 252 of the insulating layer 250. In some embodiments, the insulating layer 250 is formed of insulating materials including oxide, nitride or glass. In some embodiments, the insulating layer 250 is formed of insulating materials which can endure a high temperature higher than, for example, about 1000° C. In some embodiments, the insulating layer 250 is formed by a method including spin coating, chemical vapor deposition (CVD), physical vapor deposition (PVD), thermal process, other applicable processes, or a combination thereof. In some embodiments, a thickness of the insulating layer 250 is in a range from about 100 Å to about 2000 Å for various operation voltages of the semiconductor devices formed on the second semiconductor substrate 300.

Afterwards, please refer to FIGS. 7 and 9; in operation 606, a second semiconductor substrate 300 is bonded over the first semiconductor substrate 200 by connecting to the insulator layer 250 by a bonding process such as a hot pressing process. In some embodiments, the second semiconductor substrate 300 includes a row semiconductor wafer. In some embodiments, the second semiconductor substrate 300 serves as a substrate for semiconductor devices formed directly on the second semiconductor substrate 300. In some embodiments, the bottom surface 252 of the insulating layer 250 is in contact with the second semiconductor substrate 300 after the bonding process. Therefore, the insulating layer 250 underneath the second semiconductor substrate 300 serves as an electrical isolation feature to isolate between the semiconductor devices formed on the second semiconductor substrate 300. In some embodiments, the top surface 254 and the bottom surface 252 of the insulating layer 250 fully or partially covers the first semiconductor substrate 200 and the second semiconductor substrate 300 as shown in FIG. 9, respectively.

In some embodiments, a wafer-thinning process is performed on the second semiconductor substrate 300 to thin down the second semiconductor substrate 300. As a result, a thickness $T_1$ of the first semiconductor substrate 200 is greater than a thickness $T_2$ of the second semiconductor substrate 300 as shown in FIG. 9. Therefore, various doped regions of the semiconductor devices, for example, well doped regions, can occupy from bottom to top of the second semiconductor substrate 300. In some embodiments, the second semiconductor substrate 300 includes two device-forming regions (such as device-forming regions 202 and 204 as shown in FIG. 10) for different semiconductor devices being formed within the device-forming regions. The device-forming regions are laterally isolated from each other by isolation features (such as the isolation features 302 as shown in FIG. 10), such as shallow trench isolations (STIs).

Afterwards, a semiconductor device fabrication process is performed on the second semiconductor substrate 300 to form different semiconductor devices within the device-forming regions 202 and 204 as shown in FIG. 10. In some embodiments, the semiconductor device includes a metal-oxide-semiconductor (MOS) transistor device, a bipolar junction transistor (BJT), a diode, a resistor or combinations thereof. In some embodiments as shown in FIG. 10, the semiconductor device fabrication process is performed to form two identical HV MOS transistor devices 410 within the device-forming regions 202 and 204, respectively.

Please refer to FIGS. 7 and 10, in operation 608, a first well doped region, such as a HVNW 904, is formed in the device-forming region 202 by an implantation process. In some embodiments, a bottom of a boundary of the first well doped region (HVNW 904) is in direct contact with the insulating layer 250. That is to say, the bottom of the boundary of the first well doped region (HVNW 904) within the device-forming region 202 is aligned with an interface between the second semiconductor substrate 300 and the insulating layer 250 (also serves as the top surface 254 of the insulating layer 250).

Afterwards, please refer to FIGS. 7 and 10; in operation 610, a second well doped region, such as another HVNW 904, is formed in the device-forming region 204 by an implantation process. In some embodiments, a bottom of a boundary of the first well doped region (HVNW 904) is in direct contact with the insulating layer 250. That is to say, the bottom of the boundary of the second well doped region (HVNW 904) within the device-forming region 204 is aligned with an interface between the second semiconductor substrate 300 and the insulating layer 250 (also serves as the top surface 254 of the insulating layer 250).

Afterwards, a number of subsequent processes are performed on the second semiconductor substrate to fabricating the two identical HV MOS transistor devices 410 within the device-forming regions 202 and 204, respectively. In some embodiments as shown in FIG. 10, HVPWs 928 adjacent to opposite sides of the HVNW 904 within the device-forming regions 202 and 204 are formed in the device-forming regions 202 and 204 by an implantation process. In some embodiments, a bottom of a boundary of each of the HVPWs 928 within the device-forming region 202 or 204 is in direct contact with the insulating layer 250. That is to say, the bottom of the boundary of the HVPWs 928 within the device-forming region 202 or 204 is aligned with an interface between the second semiconductor substrate 300 and the insulating layer 250 (also serves as the top surface 254 of the insulating layer 250).

Afterwards, as shown in FIG. 10, two gate structures 356 are respectively formed over the HVNW 904 and HVPW 928 within the device-forming regions 202 and 204, in accordance with some embodiments. In some embodiments, the gate structures 356 are formed by a deposition process and a patterning process. In some embodiments as shown in FIG. 10, a portion of each of the gate structures 356 covers the isolation features 302 over the HVNW 304.

Afterwards, as shown in FIG. 10, a number of N-type heavily (N+) doped regions and P-type heavily (P+) doped regions are formed within the device-forming regions 202 and 204. In some embodiments as shown in FIG. 10, the N+ doped regions formed over the HVNW 904 serve as drain doped regions for HV MOS transistor devices 410. The N+ doped regions and the P+ doped region adjacent to each other formed over the HVPW 928 serve as source doped regions for HV MOS transistor devices 410. The N+ doped regions formed over the HVNW 904 away from the gate structures 356 serve as substrate pick-up doped regions. The P+ doped regions formed over the HVPW 928 away from the gate structures 356 serve as guard ring doped regions.

Afterwards, a back-end process is performed to form an interconnection for the HV MOS transistor devices 410 within the device-forming regions 202 and 204, respectively. As shown in FIG. 10, an interlayer dielectric layer (ILD) 358 is formed over the second semiconductor substrate 300 by a deposition process, in accordance with some embodiments. Afterwards, various contact plugs 360, 362, 364, 366 and 368 are formed through the ILD 358 for electrical connection with various terminals of the HV MOS transistor devices 410. For example, the contact plugs 360 are electrically connected to the gate structures 356 within the device-forming regions 202 and 204, respectively. The contact plugs 364 are electrically connected to the N+ doped regions formed over the HVNW 904 (the drain doped regions) within the device-forming regions 202 and 204, respectively. The contact plugs 362 are electrically connected to the adjacent N+ and P+ doped regions over the HVPW 928 (the drain doped regions) within the device-forming regions 202 and 204, respectively. The contact plugs 366 are electrically connected to the N+ doped regions formed over the HVNW 904 away from the gate structures 356 (the substrate pick-up doped regions) within the device-forming regions 202 and 204, respectively. The contact plugs 368 are electrically connected to the P+ doped regions formed over the HVPW 928 away from the gate structures 356 (the guard ring doped regions) within the device-forming regions 202 and 204, respectively. In some embodiments, the contact plugs 360, 362, 364, 366 and 368 are formed by patterning, deposition and planarization processes.

Afterwards, various conductive patterns 372, 374, 376, 378 and 380 are formed on the ILD 358, as shown in FIG. 10 in accordance with some embodiments. The conductive patterns 372 are electrically connected to contact plugs 360 for the gate structures 356. The conductive patterns 374 are electrically connected to contact plugs 362 for the source doped regions. The conductive patterns 376 are electrically connected to contact plugs 364 for the drain doped regions. The conductive patterns 378 are electrically connected to contact plugs 368 for the guard ring doped regions. The conductive patterns 380 are electrically connected to contact plugs 366 for the substrate pick-up doped regions.

Afterwards, another dielectric layer 370 is formed over the second semiconductor substrate 300 by a deposition process, as shown in FIG. 10 in accordance with some embodiments. In some embodiments, the dielectric layer 370 serves as an intermetal dielectric layer or a passivation layer. After performing the aforementioned processes, the semiconductor device structure 500g including the two identical HV MOS transistor devices 410 within the device-forming regions 202 and 204 is formed as shown in FIG. 10.

In some embodiments, bottoms of boundaries of the HVNWs 904 and HVPWs 928 of the HV MOS transistor devices 410 within the two device-forming regions 202 and 204 are aligned with an interface between the second semiconductor substrate 300 and the insulating layer 250 (also serves as the top surface 254 of the insulating layer 250), as shown in FIG. 10. That is to say, the two HV MOS transistor devices 401 respectively formed within the two device-forming regions 202 and 204 are isolated from each other not only by the isolation features 302 lateral between the device-forming regions 202 and 204, but also by the insulating layer 250 underneath the bottom of the boundary of the HVNW 306. Therefore, a vertical current (noise) path of a parasitic bipolar junction transistor (BJT), which is constructed by the P+ doped region in HVPW 308, the HVPW 928 and the HVNW 904, of any of the two HV MOS transistor devices 410 can be eliminated by the insulating layer 250 directly under the bottom of the boundary of the HVNWs 904 and HVPWs 928.

Figure 11:
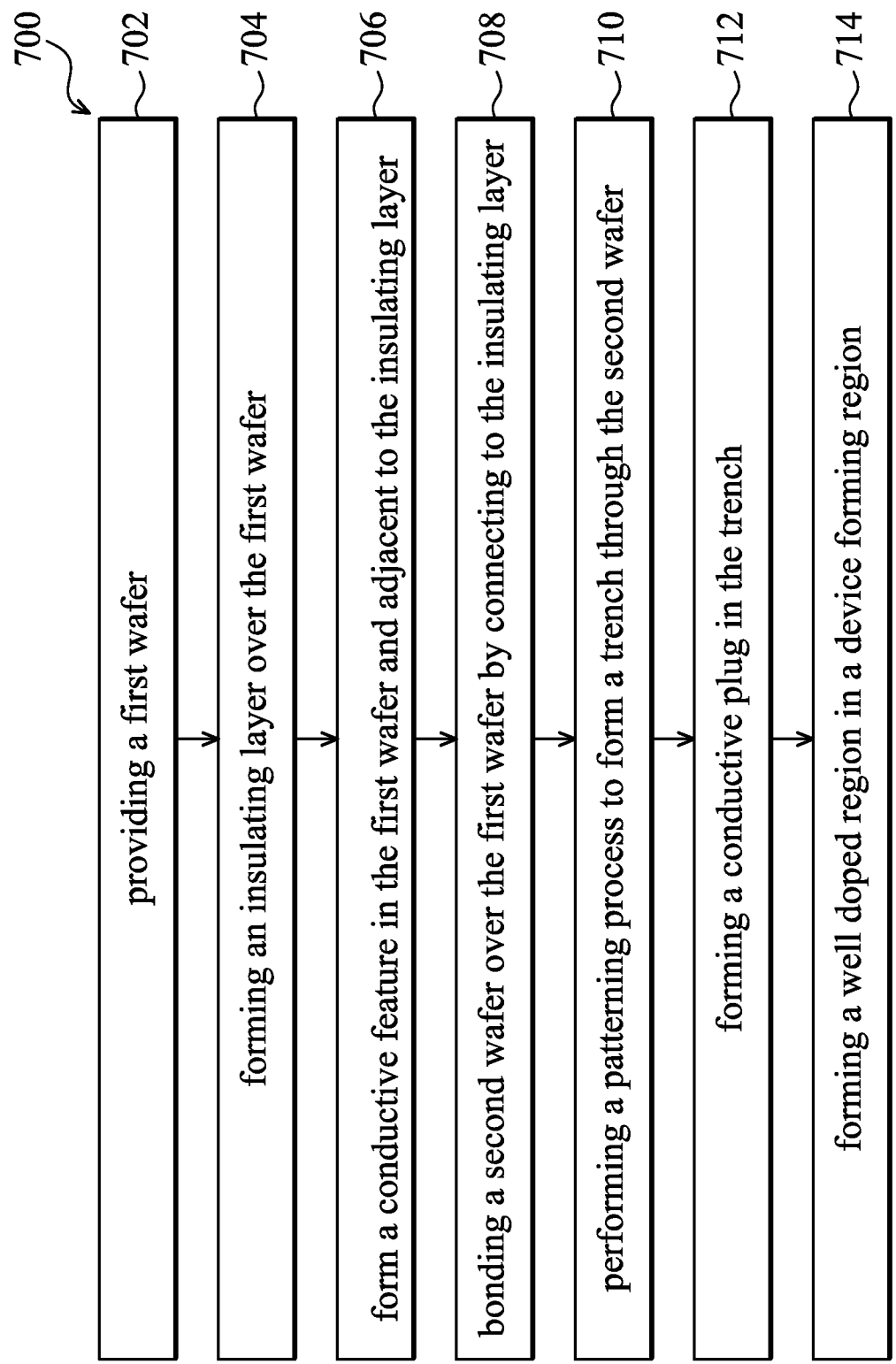
FIG. 11 is a flow chart of a method for forming a semiconductor device structure in accordance with some embodiments of the disclosure.
Figure 12:
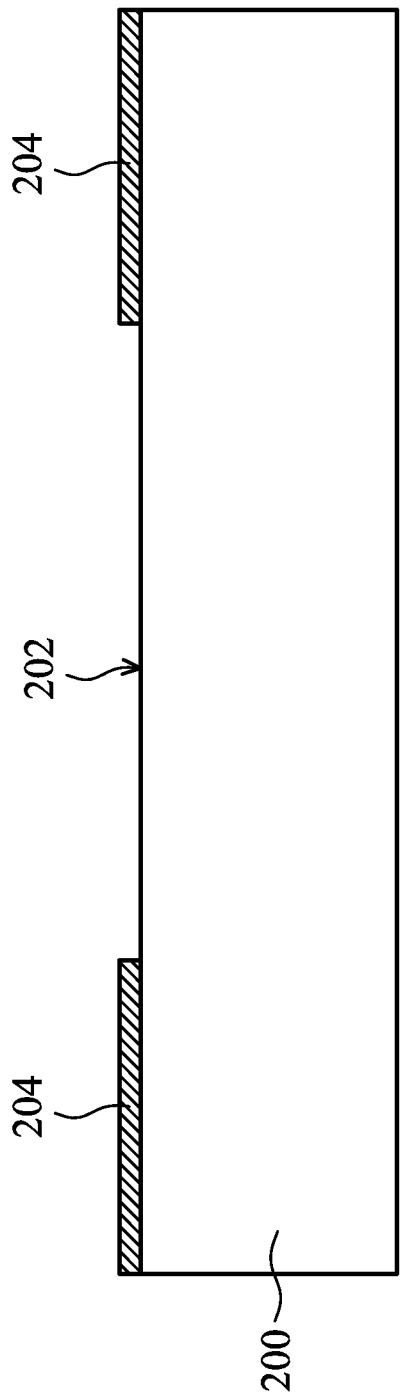
FIGS. 12-17 are cross-sectional views of various stages of a method for forming a semiconductor device structure in accordance with some embodiments of the disclosure.
Figure 13:
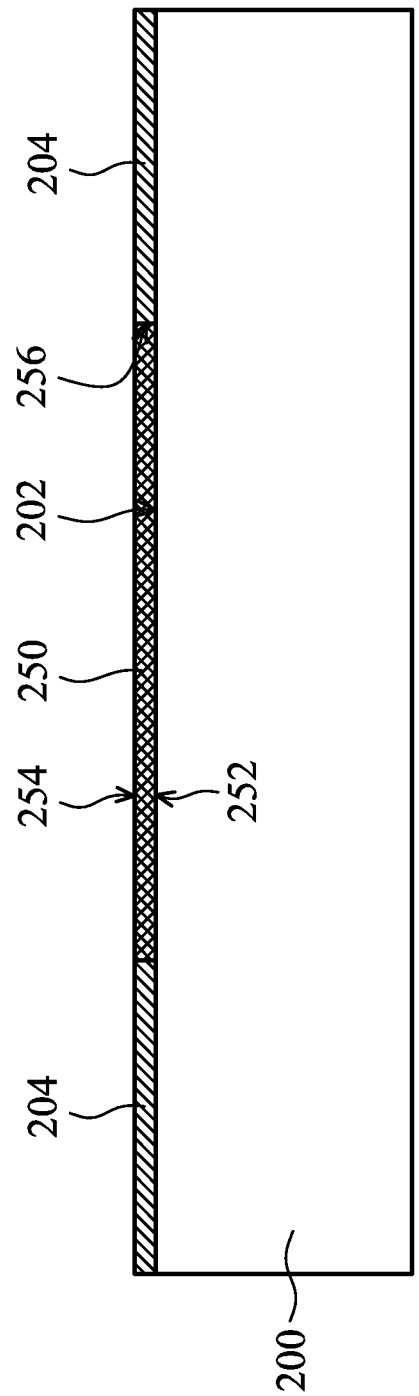

FIG. 11 is a flow chart of a method 700 for forming a semiconductor device structure in accordance with some embodiments. FIGS. 12-17 are cross-sectional views of various stages of a method for forming a semiconductor device structure 500h in accordance with some embodiments of the disclosure. Please refer to FIGS. 11 and 12, in operation 702, a first semiconductor substrate 200 is provided. In some embodiments, the first semiconductor substrate 200 includes a row semiconductor wafer. In some embodiments, the first semiconductor substrate 200 serves as a carrier wafer. Afterwards, a mask pattern 204 is formed covering a portion of a top surface 202 of the first semiconductor substrate 200, as shown in FIG. 12 in accordance with some embodiments. In some embodiments, the mask pattern 204 defines a formation position of a subsequent insulator layer (insulator layer 250 as shown in FIG. 13). In some embodiments, the mask pattern 204 is formed of an insulating material including nitride. In some embodiments, the mask pattern 204 is formed by a deposition process and a subsequent patterning process.

Afterwards, please refer to FIGS. 11 and 13; in operation 704, an insulator layer 250 is formed over the first semiconductor substrate 200. The operation of forming the insulator layer 250 over the first semiconductor substrate 200 further includes growing the insulator layer 250 over the top surface 202 of the first semiconductor substrate 200 without covered by the mask pattern 204. In some embodiments, the insulating layer 250 has a top surface 254, a bottom surface 252 opposite to the top surface 254 and a side surface 256. The bottom surface 252 of the insulating layer 250 is in contact with the first semiconductor substrate 200. Also, the side surface 256 of the insulating layer 250 is in contact with the mask pattern 204. In some embodiments as shown in FIGS. 11 and 13, the insulating layer 250 is formed of insulating materials. For example, the insulating materials include oxide. In some embodiments, the insulating layer 250 is formed by methods includes spin coating, chemical vapor deposition (CVD), physical vapor deposition (PVD), thermal process, other applicable processes, or a combination thereof. In some embodiments, a thickness of the insulating layer 250 is in a range from about 100 Å to about 2000 Å for various operation voltages of the semiconductor devices formed on the second semiconductor substrate 300.

Figure 14:
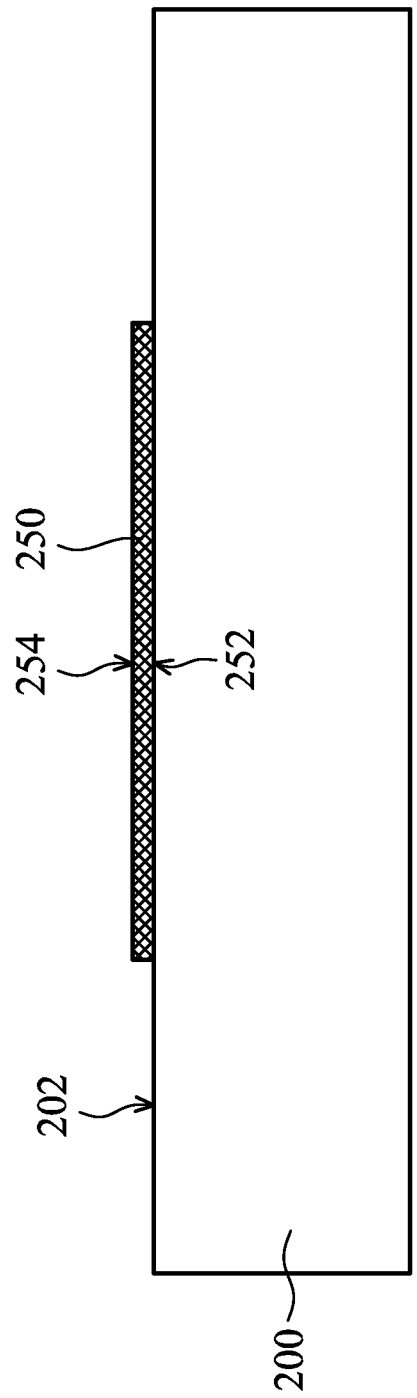

Afterwards, please refer to FIG. 14, the mask pattern 204 is removed from the first semiconductor substrate 200. In some embodiments, the insulating layer 250 partially covers the top surface 202 of the first semiconductor substrate 200 as shown in FIG. 14. In some embodiments, the mask pattern 204 is removed by a wet process using hot phosphoric acid ($H_3PO_4$).

Figure 15:
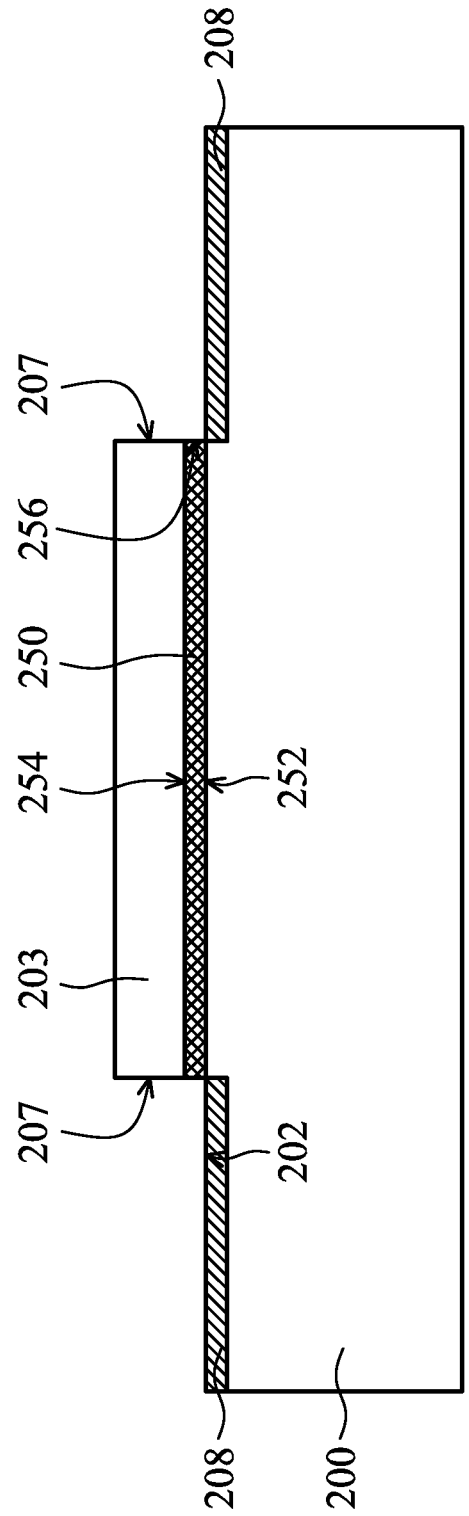

Afterwards, please refer to FIG. 15, a mask pattern 206 is formed fully covering the insulating layer 250. Therefore, a side surface 207 of the mask pattern 203 is aligned with the side surface 256 of the mask pattern 204. In some embodiments, the mask pattern 203 is formed of photoresist materials. In some embodiments, the mask pattern 206 is formed by a photolithography process.

Afterwards, please refer to FIGS. 14 and 15; in operation 706, a number of conductive features 208 are formed in the first semiconductor substrate 200 and adjacent to the side surface 256 of the insulating layer 250. In some embodiments, the conductive features 208 serve as resistors. In some embodiments, the conductive features 208 are formed by performing an implantation process to dope a portion of the first semiconductor substrate 200, which is not covered by the mask pattern 203, from the top surface 202 of the first semiconductor substrate 200. Afterwards, the mask pattern 206 is removed by a stripping process.

Figure 16:
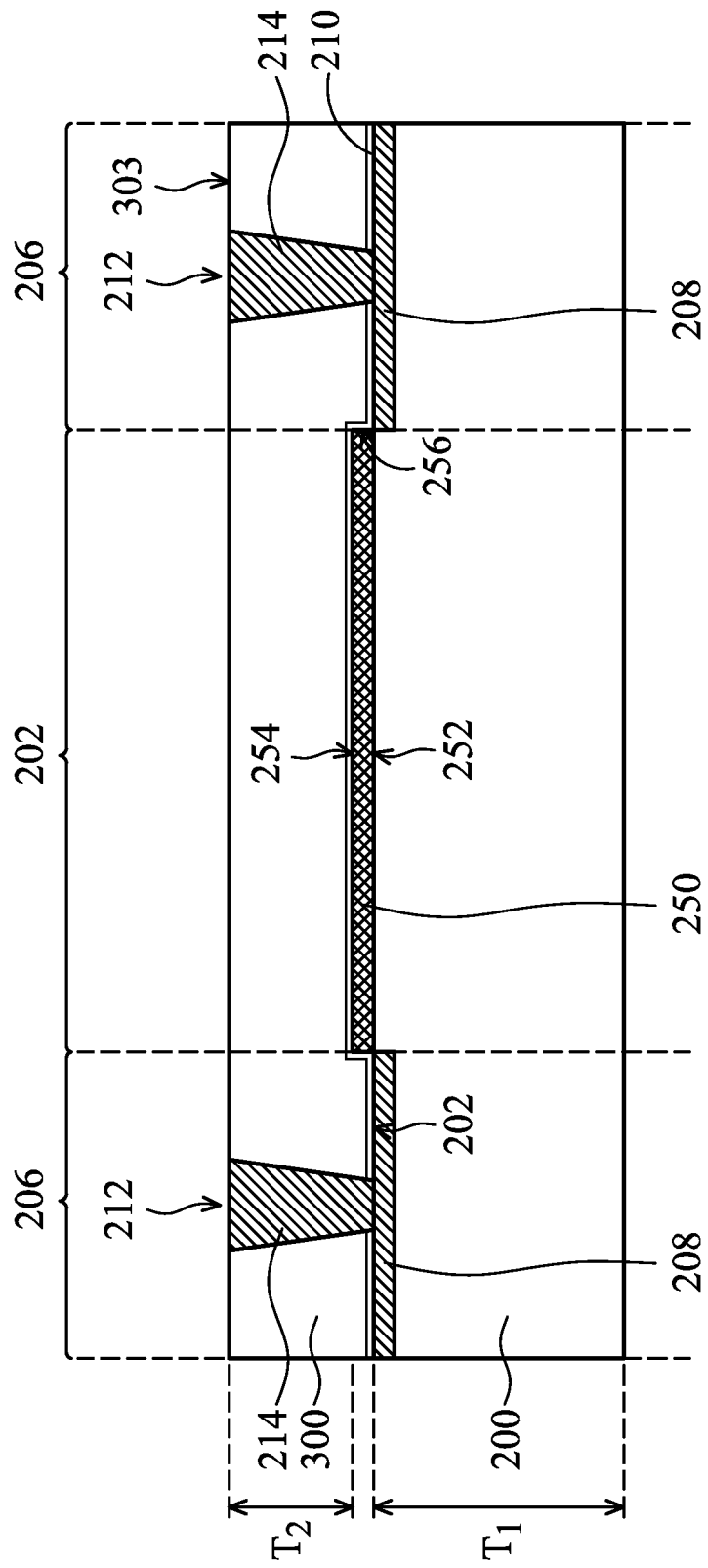

Afterwards, please refer to FIG. 16, an insulating layer 210 is formed covering insulating layer 250 and the conductive features 208, in accordance with some embodiments. In some embodiments, the insulating layer 210 serves as an isolation feature for the conductive features 208. In some other embodiments, however, the insulating layer 210 is not formed.

Afterwards, please refer to FIGS. 11 and 16; in operation 708, a second semiconductor substrate 300 is bonded over the first semiconductor substrate 200 by connecting to the insulator layer 250 by a bonding process such as a hot pressing process. In some embodiments, the second semiconductor substrate 300 serves as a substrate for semiconductor devices formed directly on the second semiconductor substrate 300. In some embodiments, the top surface 254 of the insulating layer 250 is in contact with the second semiconductor substrate 300 after the bonding process.

Afterwards, a wafer-thinning process is performed on the second semiconductor substrate 300, in accordance with some embodiments. A thickness $T_1$ of the first semiconductor substrate 200 is greater than a thickness $T_2$ of the second semiconductor substrate 300 as shown in FIG. 16. Therefore, various doped regions of the semiconductor devices, for example, well doped regions, can occupy from bottom to top of the second semiconductor substrate 300. In some embodiments, the second semiconductor substrate 300 includes a device-forming region 202 and a pick-up region 206 as shown in FIG. 16. The device-forming region 202 is defined by the insulating layer 250 partially covering the first semiconductor substrate 200 and the second semiconductor substrate 300. The insulating layer 250 serves as an electrical isolation feature for the device-forming region 202. Therefore, a projection region of the device-forming region 202 is positioned inside the insulating layer 250. The pick-up region 206 is defined by a region of the second semiconductor substrate 300 where the conductive feature 208 is positioned thereunder. In some embodiments, active and/or passive semiconductor devices including a MOS transistor device, a BJT, a diode, a resistor or combinations thereof are prohibited from being formed on and/or in the second semiconductor substrate 200 within the pick-up region 206. The device-forming region 202 and the pick-up region 206 are laterally isolated from each other by isolation features (such as the isolation features 302 as shown in FIG. 17), such as shallow trench isolations (STIs).

Afterwards, please refer to FIGS. 11 and 16 again; in operation 710, a patterning process is performed to remove a portion of the second semiconductor substrate 300 from a top surface 303 of the second semiconductor substrate 300 in the pick-up region 206. In some embodiments, the conductive features 208 also serve as stoppers for the patterning process. After performing the patterning process, recesses 212 are formed through the second semiconductor substrate 300. The conductive features 208 are exposed to the recesses 212. In some embodiments, the recesses 212 are trenches.

Afterwards, please refer to FIGS. 11 and 16 again; in operation 712, a conductive material (not shown) is filled in the recesses 212 by a deposition process. Afterwards, a planarization process is performed to remove an unnecessary portion of the conductive material over the top surface 303 of the second semiconductor substrate 300. Therefore, conductive plugs 214 are formed in the recesses 212, respectively. In some embodiments, the conductive plugs 214 serve as electrical connections such as through hole vias (TSVs) for the conductive features 208.

Figure 17:
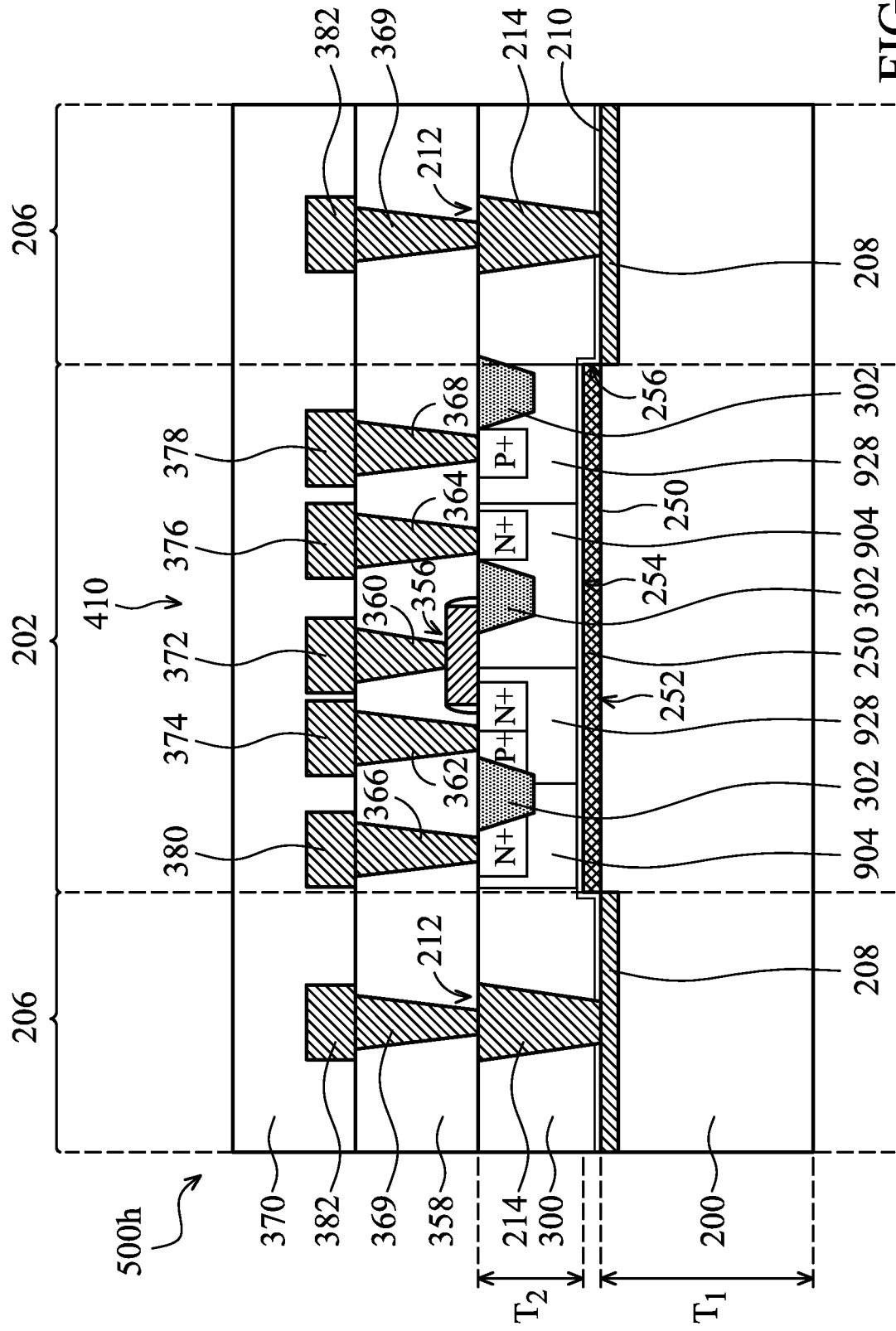

Afterwards, a semiconductor device fabrication process is performed on the second semiconductor substrate 300 to from a semiconductor device within the device-forming region 202 as shown in FIG. 17. In some embodiments, the semiconductor device includes a metal-oxide-semiconductor (MOS) transistor device, a bipolar junction transistor (BJT), a diode, a resistor or combinations thereof. In some embodiments as shown in FIG. 17, the semiconductor device fabrication process is performed to form a HV MOS transistor device 410 within the device-forming region 202.

Afterwards, please refer to FIGS. 11 and 17; in operation 714, a well doped region, such as a HVNW 904, is formed in the device-forming region 202 by an implantation process. In some embodiments, a bottom of a boundary of the well doped region (HVNW 904) is in contact with the insulating layer 210 as shown in FIG. 17. In some other embodiments, the insulating layer 210 is not formed or not covers the insulating layer 250. In these cases, the bottom of the boundary of the well doped region (HVNW 904) is in contact with the insulating layer 250. In these cases, the bottom of the boundary of the well doped region (HVNW 904) within the device-forming region 202 is aligned with an interface between the second semiconductor substrate 300 and the insulating layer 250 (also serves as the top surface 254 of the insulating layer 250).

Afterwards, a number of subsequent processes are performed on the second semiconductor substrate to fabricate the HV MOS transistor device 410 within the device-forming region 202. In some embodiments as shown in FIG. 17, HVPWs 928 adjacent to opposite sides of the HVNW 904 within the device-forming region 202 are formed by an implantation process. In some embodiments, a bottom of a boundary of each of the HVPWs 928 is in contact with the insulating layer 210 as shown in FIG. 17. In some other embodiments, the insulating layer 210 is not formed or does not cover the insulating layer 250. In these cases, the bottom of the boundary of the each of the HVPWs 928 is in contact with the insulating layer 250.

Afterwards, as shown in FIG. 17, a gate structure 356 is formed both over the HVNW 904 and HVPW 928 within the device-forming region 202. In some embodiments as shown in FIG. 17, a formation position and formation processes of the gate structure 356 is similar to the gate structure 356 of the HV MOS transistor device 410 within the device-forming regions 202 or 204 as shown in FIG. 10.

Afterwards, as shown in FIG. 17, a number of N-type heavily (N+) doped regions and P-type heavily (P+) doped regions are formed within the device-forming region 202. In some embodiments as shown in FIG. 17, formation positions and formation processes of the N+ doped regions and the P+ doped regions are similar to the N+ doped regions and the P+ doped regions of the HV MOS transistor device 410 within the device-forming regions 202 or 204 as shown in FIG. 10.

Afterwards, a back-end process is performed to form an interconnection for the HV MOS transistor devices 410 within the device-forming region 202 and the conductive features 208 within the pick-up region 206. As shown in FIG. 17, an interlayer dielectric layer (ILD) 358 is formed over the second semiconductor substrate 300. Afterwards, various contact plugs 360, 362, 364, 366, 368 and 369 are formed through the ILD 358. In some embodiments as shown in FIG. 17, formation positions and formation processes of the contact plugs 360, 362, 364, 366 and 368 are similar to the contact plugs 360, 362, 364, 366 and 368 of the HV MOS transistor device 410 within the device-forming regions 202 or 204 as shown in FIG. 10. The contact plugs 369 are electrically connected to the conductive plugs 214 formed over the conductive features 208 within the pick-up region 206, respectively.

Afterwards, various conductive patterns 372, 374, 376, 378, 380 and 382 are formed on the ILD 358, in accordance with some embodiments. In some embodiments as shown in FIG. 17, formation positions and formation processes of the conductive patterns 372, 374, 376, 378 and 380 are similar to the conductive patterns 372, 374, 376, 378 and 380 of the HV MOS transistor device 410 within the device-forming regions 202 or 204 as shown in FIG. 10. Also, the conductive patterns 382 are electrically connected to contact plugs 369 for the conductive features 208 within the pick-up region 206, respectively.

Afterwards, another dielectric layer 370 is formed over the second semiconductor substrate 300 by a deposition process, as shown in FIG. 17 in accordance with some embodiments. In some embodiments, the dielectric layer 370 serves as an intermetal dielectric layer or a passivation layer. After performing the aforementioned processes, the semiconductor device structure 500h is formed as shown in FIG. 17. In some embodiments, the semiconductor device structure 500h includes the conductive features 208 formed in the first semiconductor substrate 200 and the HV MOS transistor device 410 formed within the device-forming region 202 of the second semiconductor substrate 300. The conductive features 208 are electrically connected to the conductive pattern 382 through the conductive plugs 214 within the pick-up region 206 in some embodiments.

In some embodiments as shown in FIG. 17, bottoms of boundaries of the HVNWs 904 and HVPWs 928 of the HV MOS transistor device 410 within the device-forming region 202 are aligned with an interface between the second semiconductor substrate 300 and the insulating layer 210. In some other embodiments, the insulating layer 210 is not formed or not covers the insulating layer 250. In these cases, the bottoms of the boundaries of the HVNWs 904 and HVPWs 928 of the HV MOS transistor device 410 within the device-forming region 202 are aligned with an interface between the second semiconductor substrate 300 and the insulating layer 250 (also serves as the top surface 254 of the insulating layer 250). That is to say, the HV MOS transistor devices 410 within the device-forming region 202 is isolated from the conductive patterns 382 under the pick-up region 206 of the second semiconductor substrate 300 not only by the isolation features 302 lateral between the device-forming region 202 and the pick-up region 206, but also by the insulating layer 250 underneath the bottom of the boundary of the HVNWs 904 and HVPWs 928. Therefore, a vertical current (noise) path of a parasitic bipolar junction transistor (BJT), which is constructed by the P+ doped region in HVPW 928, the HVPW 928 and the HVNW 904, of the HV MOS transistor device 410 can be eliminated by the insulating layer 250 directly under the bottom of the boundary of the HVNWs 904 and HVPWs 928. In some embodiments, two or more than two device-forming regions can be formed directly over the insulating layer 250. Therefore, projection regions of the device-forming regions are positioned inside the insulating layer 250.

Figure 18:
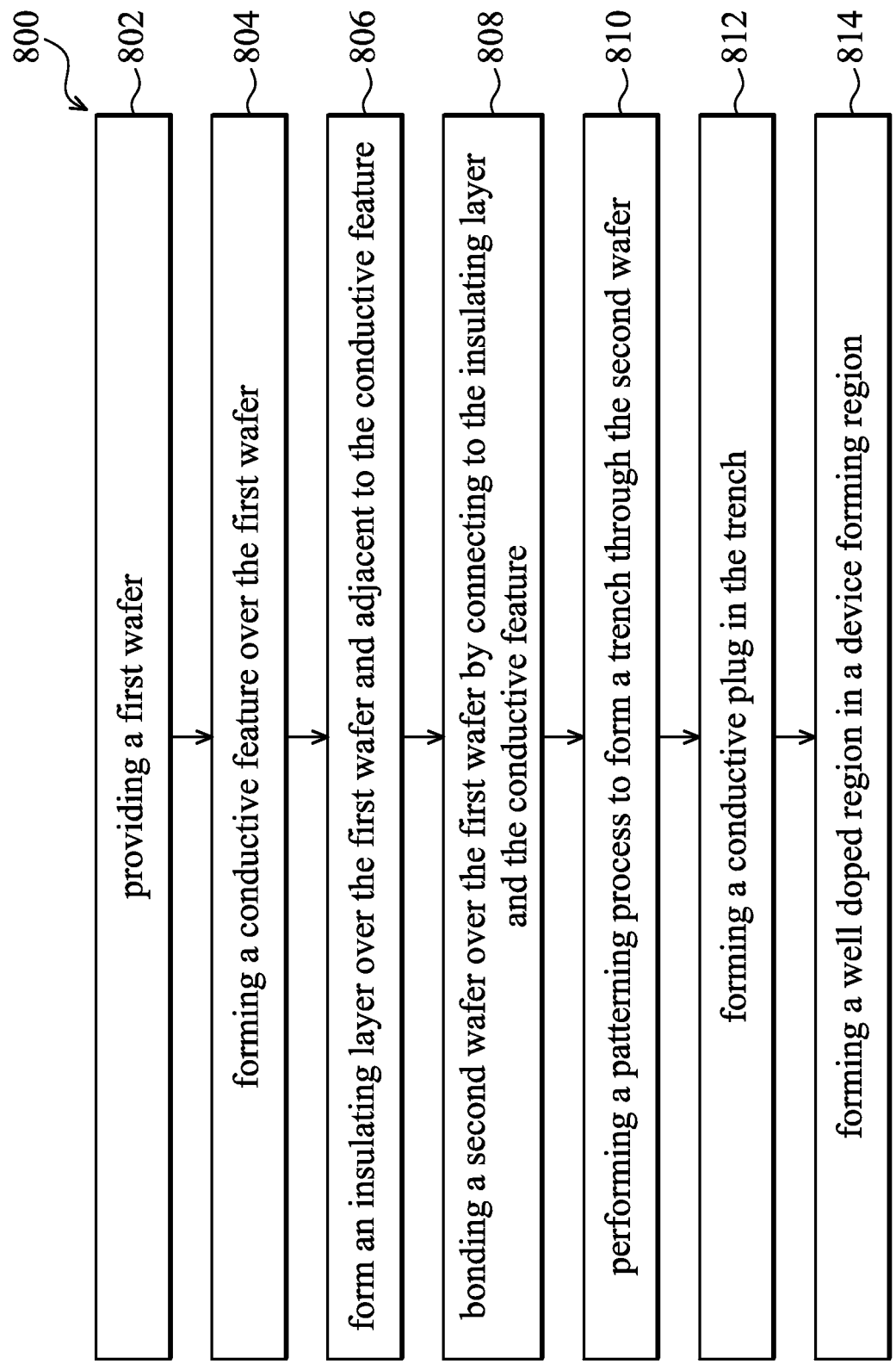
FIG. 18 is a flow chart of a method for forming a semiconductor device structure in accordance with some embodiments of the disclosure.

FIG. 18 is a flow chart of a method 800 for forming a semiconductor device structure in accordance with some embodiments. FIGS. 19-24 are cross-sectional views of various stages of a method for forming a semiconductor device structure 500i in accordance with some embodiments of the disclosure. Please refer to FIGS. 18 and 19, in operation 802, a first semiconductor substrate 200 is provided. In some embodiments, the first semiconductor substrate 200 includes a row semiconductor wafer. In some embodiments, the first semiconductor substrate 200 serves as a carrier wafer. Afterwards, a conductive material 211 is formed fully covering a top surface 202 of the first semiconductor substrate 200. In some embodiments, the conductive features 208 are formed by methods including physical vapor deposition (PVD) process. In some embodiments, the physical vapor deposition (PVD) process includes sputtering, plating, other applicable processes, or a combination thereof.

Figure 19:
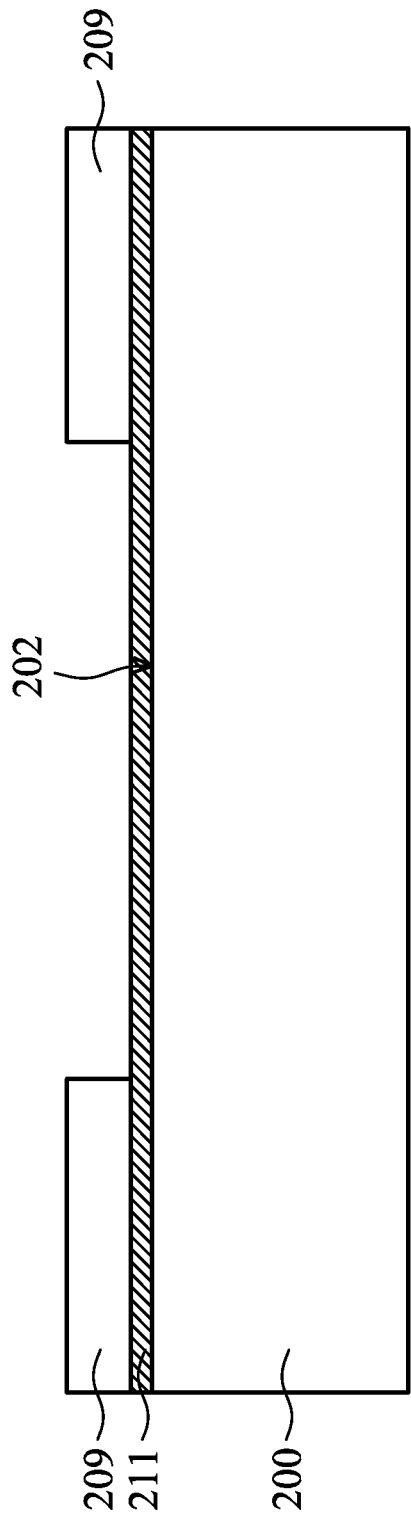
FIGS. 19-24 are cross-sectional views of various stages of a method for forming a semiconductor device structure in accordance with some embodiments of the disclosure.
Figure 22:
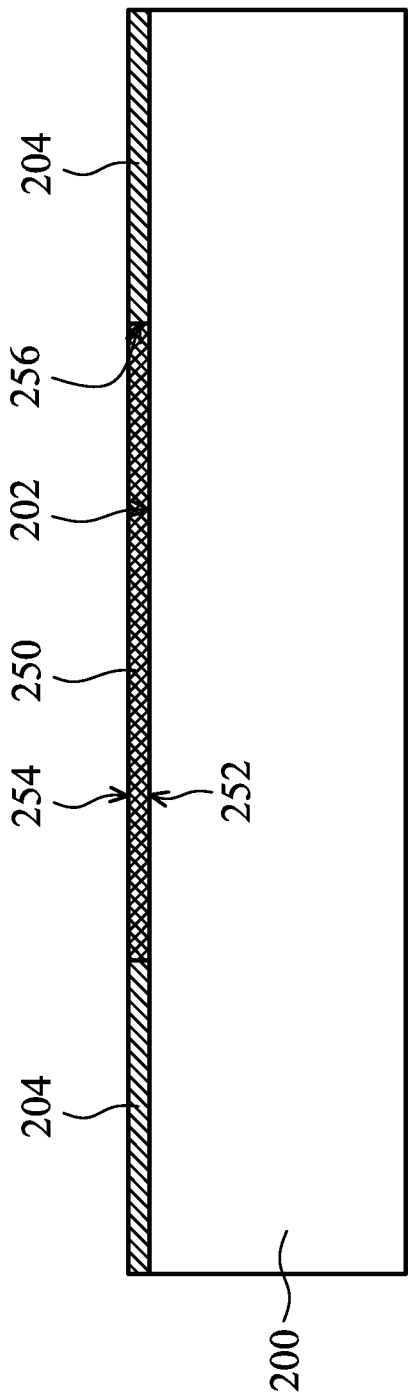

Afterwards, a mask pattern 209 is formed covering a portion of the conductive material 211, as shown in FIG. 19 in accordance with some embodiments. In some embodiments, the mask pattern 209 defines a formation position of a subsequent conductive feature (conductive feature(s) 208 as shown in FIG. 22). In some embodiments, the mask pattern 209 is formed of photoresist materials. In some embodiments, the mask pattern 209 is formed by a photolithography process.

Figure 20:
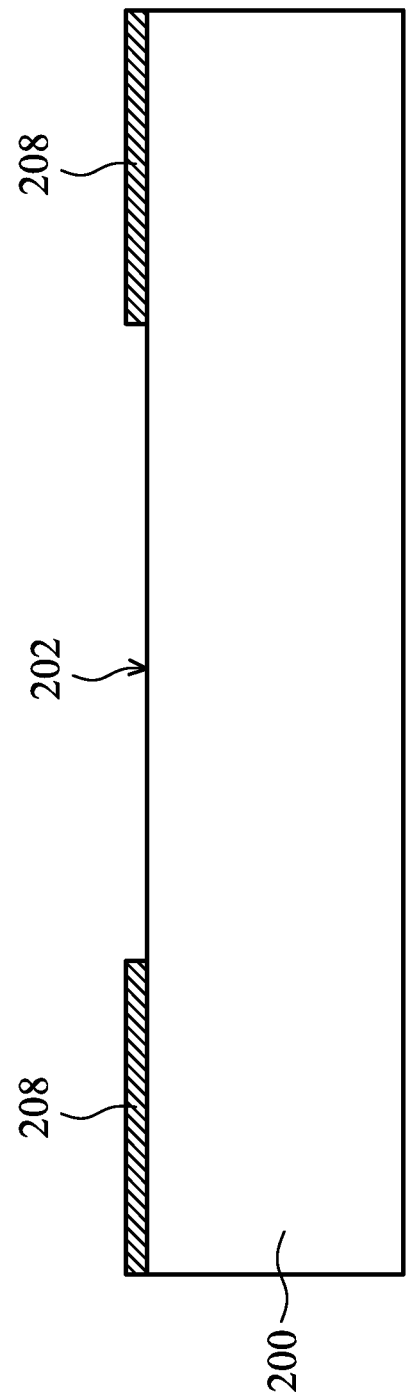

Afterwards, please refer to FIGS. 18 and 20; in operation 804, a number of conductive features 208 are formed over the top surface 202 of the first semiconductor substrate 200, as shown in FIG. 20 in accordance with some embodiments. In some embodiments, the conductive features 208 serve as resistors. In some embodiments, the conductive features 208 are formed by performing a patterning process to remove a portion of the conductive material 211, which is not covered by the mask pattern 209, until the top surface 202 of the first semiconductor substrate 200 is exposed. Afterwards, the mask pattern 209 is removed by a stripping process.

Figure 21:
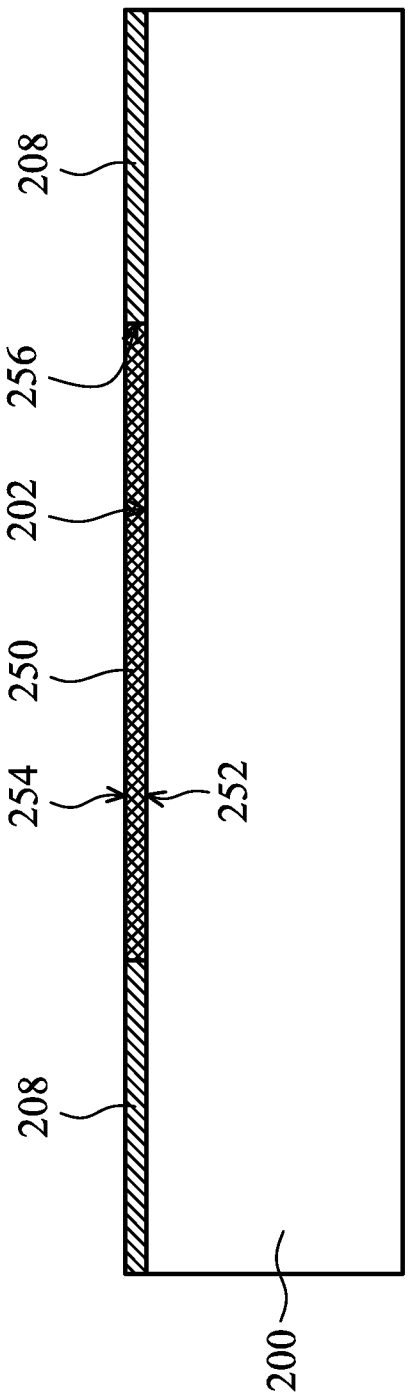

Afterwards, please refer to FIGS. 18 and 21; in operation 806, an insulating layer 250 is formed over the exposed top surface 202 of the first wafer 200 and adjacent to the conductive features 208 in accordance with some embodiments. In some embodiments, the insulating layer 250 has a top surface 254, a bottom surface 252 opposite to the top surface 254 and a side surface 256. The bottom surface 252 of the insulating layer 250 is in contact with the first semiconductor substrate 200. Also, the side surface 256 of the insulating layer 250 is in contact with the conductive feature 208. In some embodiments as shown in FIGS. 11 and 13, the insulating layer 250 is formed of insulating materials. For example, the insulating materials include oxide. In some embodiments, a thickness of the insulating layer 250 is in a range from about 100 Å to about 2000 Å for various operation voltages of the semiconductor devices formed on the second semiconductor substrate 300.

Please refer to FIG. 21, the operation of forming the insulator layer 250 over the first semiconductor substrate 200 further includes forming the insulator layer 250 over the top surface 202 of the first semiconductor substrate 200, covering the conductive features 208 in accordance with some embodiments. In some embodiments, the insulating layer 250 is formed by methods includes spin coating, chemical vapor deposition (CVD), physical vapor deposition (PVD), thermal process, other applicable processes, or a combination thereof. Afterwards, the insulator layer 250 is subjected by a planarization process including chemical mechanical polishing (CMP) to remove unnecessary portions of the insulator layer 250, which are formed over the conductive features 208. After performing the planarization process, the top surface 254 of the insulator layer 250 is aligned with top surfaces of the conductive features 208.

Figure 23:
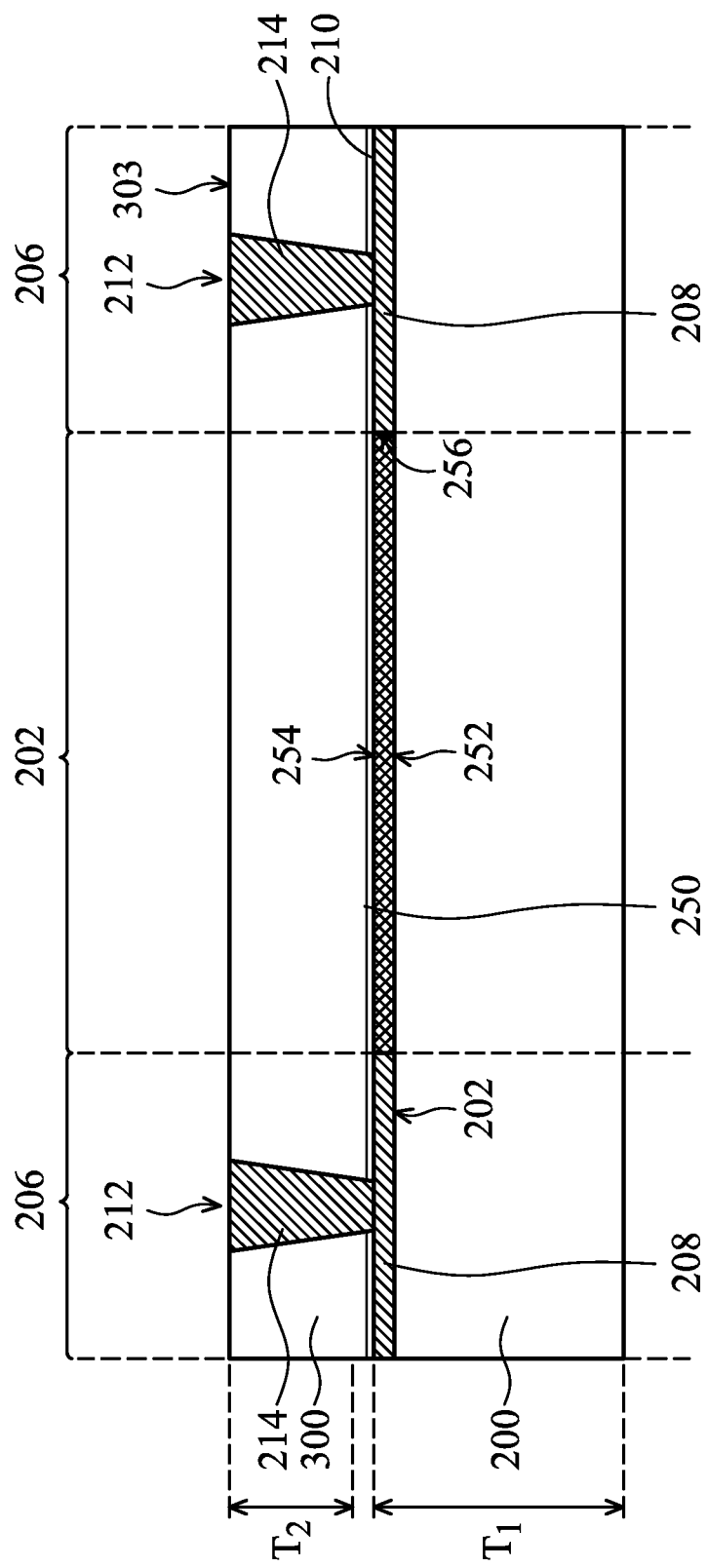

Afterwards, please refer to FIG. 23, an insulating layer 210 is formed covering insulating layer 250 and the conductive features 208, in accordance with some embodiments. In some embodiments, the insulating layer 210 serves as an isolation feature for the conductive features 208. In some other embodiments, however, the insulating layer 210 is not formed.

Afterwards, please refer to FIGS. 18 and 23; in operation 808, a second semiconductor substrate 300 is bonded over the first semiconductor substrate 200 by connecting to the insulator layer 250 and the conductive features 208 by a bonding process such as a hot pressing process. In some embodiments, the second semiconductor substrate 300 serves as a substrate for semiconductor devices formed directly on the second semiconductor substrate 300. In some embodiments, the top surface 254 of the insulating layer 250 and the top surfaces of the conductive features 208 are in contact with the second semiconductor substrate 300 after the bonding process.

Afterwards, a wafer-thinning process is performed on the second semiconductor substrate 300, in accordance with some embodiments. A thickness $T_1$ of the first semiconductor substrate 200 is greater than a thickness $T_2$ of the second semiconductor substrate 300 as shown in FIG. 23. Therefore, various doped regions of the semiconductor devices, for example, well doped regions, can occupy from bottom to top of the second semiconductor substrate 300. In some embodiments, the second semiconductor substrate 300 includes a device-forming region 202 and a pick-up region 206 as shown in FIG. 23. The device-forming region 202 is defined by the insulating layer 250 partially covering the first semiconductor substrate 200 and the second semiconductor substrate 300. The insulating layer 250 serves as an electrical isolation feature for the device-forming region 202. Therefore, a projection region of the device-forming region 202 is positioned inside the insulating layer 250. The pick-up region 206 is defined by a region of the second semiconductor substrate 300 where the conductive feature 208 is positioned thereunder. In some embodiments, active and/or passive semiconductor devices including a MOS transistor device, a BJT, a diode, a resistor or combinations thereof are prohibited from being formed on and/or in the second semiconductor substrate 200 within the pick-up region 206. The device-forming region 202 and the pick-up region 206 are laterally isolated from each other by isolation features (such as the isolation features 302 as shown in FIG. 24), such as shallow trench isolations (STIs).

Afterwards, please refer to FIGS. 18 and 23 again; in operation 810, a patterning process is performed to remove a portion of the second semiconductor substrate 300 from a top surface 303 of the second semiconductor substrate 300 in the pick-up region 206. In some embodiments, the conductive features 208 also serve as stoppers for the patterning process. After performing the patterning process, recesses 212 are formed through the second semiconductor substrate 300. The conductive features 208 are exposed to the recesses 212. In some embodiments, the recesses 212 are trenches.

Afterwards, please refer to FIGS. 18 and 23 again; in operation 812, a conductive material (not shown) is filled in the recesses 212 by a deposition process. Afterwards, a planarization process is performed to remove an unnecessary portion of the conductive material over the top surface 303 of the second semiconductor substrate 300. Therefore, conductive plugs 214 are formed in the recesses 212, respectively. In some embodiments, the conductive plugs 214 serve as electrical connections such as through hole vias (TSVs) for the conductive features 208.

Figure 24:
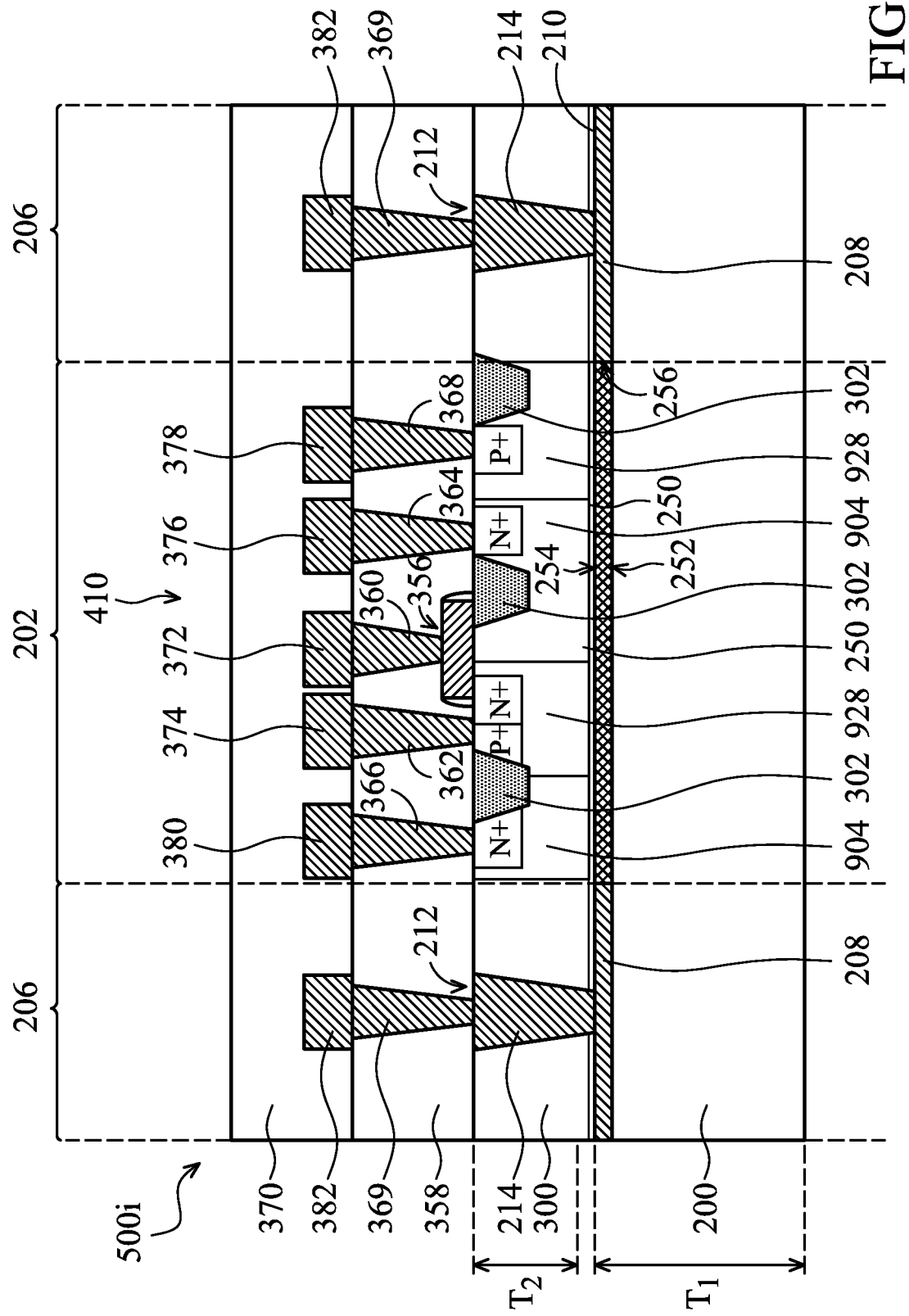

Afterwards, a semiconductor device fabrication process is performed on the second semiconductor substrate 300 to form a semiconductor device within the device-forming region 202 as shown in FIG. 24. In some embodiments, the semiconductor device includes a metal-oxide-semiconductor (MOS) transistor device, a bipolar junction transistor (BJT), a diode, a resistor or combinations thereof. In some embodiments as shown in FIG. 24, the semiconductor device fabrication process is performed to form a HV MOS transistor device 410 within the device-forming region 202.

Afterwards, please refer to FIGS. 18 and 24; in operation 814, a well doped region, such as a HVNW 904, is formed in the device-forming region 202 by an implantation process. In some embodiments, a bottom of a boundary of the well doped region (HVNW 904) is in contact with the insulating layer 210 as shown in FIG. 24. In some other embodiments, the insulating layer 210 is not formed or not covers the insulating layer 250. In these cases, the bottom of the boundary of the well doped region (HVNW 904) is in contact with the insulating layer 250. In these cases, the bottom of the boundary of the well doped region (HVNW 904) within the device-forming region 202 is aligned with an interface between the second semiconductor substrate 300 and the insulating layer 250 (also serves as the top surface 254 of the insulating layer 250).

Afterwards, a back-end process is performed to form an interconnection for the HV MOS transistor devices 410 within the device-forming region 202 and the conductive features 208 within the pick-up region 206, as shown in FIG. 24 in accordance with some embodiments. In some embodiments, the back-end process as shown in FIG. 24 is similar to the back-end process as shown in FIG. 17. After performing the aforementioned processes, the semiconductor device structure 500i is formed as shown in FIG. 24. In some embodiments, the semiconductor device structure 500i includes the conductive features 208 formed in the first semiconductor substrate 200 and the HV MOS transistor device 410 formed within the device-forming region 202 of the second semiconductor substrate 300. The conductive features 208 are electrically connected to the conductive pattern 382 through the conductive plugs 214 within the pick-up region 206 in some embodiments.

In some embodiments as shown in FIG. 24, bottoms of boundaries of the HVNWs 904 and HVPWs 928 of the HV MOS transistor device 410 within the device-forming region 202 are aligned with an interface between the second semiconductor substrate 300 and the insulating layer 210. In some other embodiments, the insulating layer 210 is not formed or not covers the insulating layer 250. In these cases, the bottoms of the boundaries of the HVNWs 904 and HVPWs 928 of the HV MOS transistor device 410 within the device-forming region 202 are aligned with an interface between the second semiconductor substrate 300 and the insulating layer 250 (also serves as the top surface 254 of the insulating layer 250). That is to say, the HV MOS transistor devices 410 within the device-forming region 202 is isolated from the conductive patterns 382 under the pick-up region 206 of the second semiconductor substrate 300 not only by the isolation features 302 lateral between the device-forming region 202 and the pick-up region 206, but also by the insulating layer 250 underneath the bottom of the boundary of the HVNWs 904 and HVPWs 928. Therefore, a vertical current (noise) path of a parasitic bipolar junction transistor (BJT), which is constructed by the P+ doped region in HVPW 928, the HVPW 928 and the HVNW 904, of the HV MOS transistor device 410 can be eliminated by the insulating layer 250 directly under the bottom of the boundary of the HVNWs 904 and HVPWs 928. In some embodiments, two or more than two device-forming regions can be formed directly over the insulating layer 250. Therefore, projection regions of the device-forming regions are positioned inside the insulating layer 250.

Embodiments provide a semiconductor device structure and a method for forming a semiconductor device structure. The semiconductor device structure includes a first semiconductor substrate, a second semiconductor substrate and an insulating layer. The second semiconductor substrate is bonded to the first semiconductor substrate by connecting to the insulating layer. The first semiconductor substrate serves as a carrier wafer, and the second semiconductor substrate serves as a substrate for semiconductor devices formed thereon. The insulating layer underneath the second semiconductor substrate serves as an electrical isolation feature to isolate between the semiconductor devices.

In some embodiments, a semiconductor device structure is provided. The semiconductor device structure includes a first semiconductor substrate. The semiconductor device structure also includes an insulating layer formed over the first semiconductor substrate. The semiconductor device structure further includes a second semiconductor substrate bonded to the insulating layer. The second semiconductor substrate includes a first device-forming region and a second device-forming region isolated from each other. In addition, the semiconductor device structure includes a first semiconductor device formed in the first device-forming region. The first semiconductor device includes a first well doped region. A bottom of a boundary of the first well doped region is in direct contact with the insulating layer. The semiconductor device structure also includes a second semiconductor device formed in the second device-forming region. The second semiconductor device includes a second well doped region. A bottom of a boundary of the second well doped region is in direct contact with the insulating layer.

In some embodiments, a semiconductor device structure is provided. The semiconductor device structure includes an insulating layer having a top surface, a bottom surface and a side surface. The semiconductor device structure also includes a first semiconductor substrate formed over the bottom surface of the first insulating layer. The semiconductor device structure further includes a conductive feature formed adjacent to the side surface of the insulating layer on the first semiconductor substrate. In addition, the semiconductor device structure includes a second semiconductor substrate formed over the top surface of the insulating layer. The second semiconductor substrate includes a device-forming region formed directly over the insulating layer such that a projection region of the device-forming region is positioned inside the insulating layer.

In some embodiments, a method for forming a semiconductor device structure is provided. The semiconductor device structure includes providing a first wafer. The method also includes forming an insulator layer over the first wafer.

The method further includes bonding a second wafer over the first wafer by connecting to the insulator layer.

In addition, the method includes forming a first well doped region in a first device-forming region of the second wafer. A bottom of a boundary of the first well doped region is in direct contact with the insulating layer. The method also includes a second well doped region in a second device-forming region of the second wafer isolated from the first device-forming region. A bottom of a boundary of the second well doped region is in direct contact with the insulating layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. In addition, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations. In addition, each claim constitutes a separate embodiment, and the combination of various claims and embodiments are within the scope of the disclosure.

What is claimed is:

1. A semiconductor device structure, comprising:
   a first semiconductor substrate;
   an insulating layer over the first semiconductor substrate;
   a second semiconductor substrate bonded to the insulating layer, wherein the second semiconductor substrate comprises a first device-forming region and a second device-forming region isolated from each other;
   a first semiconductor device in the first device-forming region, comprising:
      a first well doped region, wherein a bottom of a boundary of the first well doped region is in direct contact with the insulating layer;
   a second semiconductor device in the second device-forming region, comprising:
      a second well doped region, wherein a bottom of a boundary of the second well doped region is in direct contact with the insulating layer; and
   a conductive feature located between the first semiconductor substrate and the second semiconductor substrate, wherein the first semiconductor substrate and the second semiconductor substrate respectively contact opposite surfaces of the conductive feature.

2. The semiconductor device structure as claimed in claim 1, wherein the first semiconductor device or the second semiconductor device comprises a metal-oxide-semiconductor (MOS) transistor device, a bipolar junction transistor (BJT), a diode, a resistor or a combination thereof.

3. The semiconductor device structure as claimed in claim 1, wherein the first semiconductor device further comprises a first gate structure over the first well doped region, wherein the first gate structure is disposed within a boundary of the first well doped region.

4. The semiconductor device structure as claimed in claim 3, wherein the second semiconductor device further comprises a second gate structure, wherein the second gate structure is disposed within a boundary of the second well doped region.

5. The semiconductor device structure as claimed in claim 1, wherein the first semiconductor substrate and the second semiconductor substrate are in contact with opposite surfaces of the insulating layer, respectively.

6. The semiconductor device structure as claimed in claim 1, wherein the conductive layer is adjacent to the insulating layer.

7. The semiconductor device structure as claimed in claim 6, wherein the conductive feature is located adjacent to a lateral side surface of the insulating layer.

8. The semiconductor device structure as claimed in claim 7, wherein the conductive feature is a doped region in the first semiconductor substrate.

9. The semiconductor device structure as claimed in claim 6, further comprising:
   a second insulating layer between the second semiconductor substrate and the insulating layer, covering the insulating layer and the conductive feature.

10. The semiconductor device structure as claimed in claim 9, wherein the first device-forming region and the second device-forming region are formed directly over the insulating layer such that a projection region of the first device-forming region and the second device-forming region are positioned inside the insulating layer.

11. The semiconductor device structure as claimed in claim 9, further comprising:
   a recess formed through the second semiconductor substrate, wherein a portion of the conductive feature is exposed by the recess; and
   a conductive material filling the recess, electrically connected to the conductive feature.

12. A semiconductor device structure, comprising:
   an insulating layer having a top surface, a bottom surface and a side surface;
   a first semiconductor substrate over the bottom surface of the first insulating layer;
   a second semiconductor substrate over the top surface of the insulating layer, wherein the second semiconductor substrate comprises a device-forming region formed directly over the insulating layer such that a projection region of the device-forming region is positioned inside the insulating layer; and
   a conductive feature located adjacent to the side surface of the insulating layer on the first semiconductor substrate, wherein the first semiconductor substrate and the second semiconductor substrate respectively contact opposite surfaces of the conductive feature.

13. The semiconductor device structure as claimed in claim 12, further comprising:
   a semiconductor device formed in the device-forming region, comprising:
   a well doped region, wherein a bottom of a boundary of the well doped region is in direct contact with the insulating layer.

14. The semiconductor device structure as claimed in claim 13, wherein the semiconductor device comprises a metaloxide-semiconductor (MOS) transistor device, a bipolar junction transistor (BJT), a diode, a resistor or a combination thereof.

15. The semiconductor device structure as claimed in claim 12, wherein the conductive feature is located between the first semiconductor substrate and the second semiconductor substrate.

16. The semiconductor device structure as claimed in claim 13, further comprising:
   a second insulating layer between the second semiconductor substrate and the insulating layer, covering the insulating layer and the conductive feature.

17. A method for forming a semiconductor device structure, comprising:
   providing a first wafer;
   forming an insulator layer over the first wafer;
   bonding a second wafer over the first wafer by connecting to the insulator layer;
   forming a conductive feature between the first wafer and the second wafer such that the first wafer and the second wafer respectively contact opposite surfaces of the conductive feature;
   forming a first well doped region in a first device-forming region of the second wafer, wherein a bottom of a boundary of the first well doped region is in direct contact with the insulating layer; and
   forming a second well doped region in a second device-forming region of the second wafer isolated from the first device-forming region, wherein a bottom of a boundary of the second well doped region is in direct contact with the insulating layer.

18. The method as claimed in claim 17, wherein forming an insulator layer over the first wafer comprises:
   forming a mask pattern covering a portion of a top surface of the first wafer;
   growing the insulator layer over the top surface of the first wafer not covered by the mask pattern; and
   removing the mask pattern from the first wafer.

19. The method as claimed in claim 17, further comprising:
   forming a mask pattern covering the insulator layer; and
   performing an implantation process to dope a portion of the first wafer not covered by the mask pattern to form the conductive feature in the first wafer and adjacent to the insulating layer before bonding the second wafer over the first wafer.

20. The method as claimed in claim 19, further comprising:
   performing a patterning process to form a recess through the second wafer; and
   forming a conductive plug in the recess before forming the first and second well doped regions in the first and second device-forming regions.

* * * * *